(12) United States Patent
Sato

(10) Patent No.: US 7,272,057 B2
(45) Date of Patent: Sep. 18, 2007

(54) MEMORY APPARATUS

(75) Inventor: Tomotoshi Sato, Yamatokoriyama (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 10/573,460

(22) PCT Filed: Sep. 24, 2004

(86) PCT No.: PCT/JP2004/013960

§ 371 (c)(1),
(2), (4) Date: Mar. 24, 2006

(87) PCT Pub. No.: WO2005/029505

PCT Pub. Date: Mar. 31, 2005

(65) Prior Publication Data

US 2007/0036010 A1    Feb. 15, 2007

(30) Foreign Application Priority Data

Sep. 24, 2003    (JP) .............................. 2003-331889

(51) Int. Cl.
G11C 29/00  (2006.01)
(52) U.S. Cl. ...................................... 365/200; 365/195
(58) Field of Classification Search ................. 365/195
See application file for complete search history.

(56) References Cited

U.S. PATENT DOCUMENTS

| 5,446,692 | A | * | 8/1995 | Haraguchi et al. ........... 365/200 |
| 5,469,390 | A | | 11/1995 | Sasaki et al. |
| 5,544,113 | A | * | 8/1996 | Kirihata et al. ............. 365/200 |
| 6,188,618 | B1 | * | 2/2001 | Takase ....................... 365/200 |

| 2002/0024062 | A1 | 2/2002 | Nakahara et al. |

FOREIGN PATENT DOCUMENTS

| JP | 7-085691 A | 3/1995 |
| JP | 7-85961 A | 3/1995 |
| JP | 11-250691 A | 9/1999 |
| JP | 2002-25292 A | 1/2002 |

(Continued)

OTHER PUBLICATIONS

U.S. Appl. No. 10/545,511 related to International Application No. PCT/JP2004/001430, International filing date Feb. 10, 2004, 93 total pages.

(Continued)

*Primary Examiner*—Tan T. Nguyen
(74) *Attorney, Agent, or Firm*—Morrison & Foerster LLP

(57) ABSTRACT

A memory chip includes a main memory cell; a row-wise redundant memory cell and a column-wise redundant memory cell for relieving a defect existing in the main memory; an identification number designation terminal for storing an identification number corresponding to the main memory cell; an address terminal for receiving the identification number; and a redundant row selector circuit and a redundant column selector circuit for performing allocation so as to replace a defective memory space of the main memory cell with a memory space of the redundant memory cells. The redundant selector circuits allocate a memory space corresponding to the defect of the main memory cell to the redundant memory cells when the identification number received from the address terminal coincides with the identification number of the identification number specification terminal.

5 Claims, 15 Drawing Sheets

FOREIGN PATENT DOCUMENTS

JP        2003-163326 A       6/2003

OTHER PUBLICATIONS

U.S. Patent Application No. Not Yet Assigned related to International Application No. PCT/JP2004/007377, U.S. filing date Nov. 28, 2005, 130 total pages. (Preliminary claim amendment and Amendment Under Article 19 attached).

International Preliminary Report of Patentability mailed on Jul. 6, 2006 for International Patent Application No. PCT/JP2004/013960 filed Sep. 24, 2004, six pages.

* cited by examiner

| RDEN | A0~A2 | A3 | A4, A5 | A6, A7 |
|---|---|---|---|---|
| H | ROW (COLUMN)-WISE REDUNDANT RESISTOR VALUE | ROW OR COLUMN | COMMAND NUMBER | ID NUMBER |

A3=0 : REDUNDANT ROW-BASED RELIEF
A3=1 : REDUNDANT COLUMN-BASED RELIEF

A4=1, A5=0 : REDUNDANCY COMMAND 1
A4=0, A5=1 : REDUNDANCY COMMAND 2

| RDEN | A0~A5 | A6, A7 |
|---|---|---|
| L | ADDRESS | ID NUMBER |

FIG. 10A

| RDOUT | A0~A2 | A3 | A4, A5 | A6, A7 |
|---|---|---|---|---|
| H | ROW (COLUMN)-WISE REDUNDANT RESISTOR VALUE | ROW OR COLUMN | SENDER NUMBER | ID NUMBER |

A3=0 : REDUNDANT ROW-BASED RELIEF
A3=1 : REDUNDANT COLUMN-BASED RELIEF

FIG. 10B

| RDOUT | A0~A5 | A6, A7 |
|---|---|---|
| L | ADDRESS | ID NUMBER |

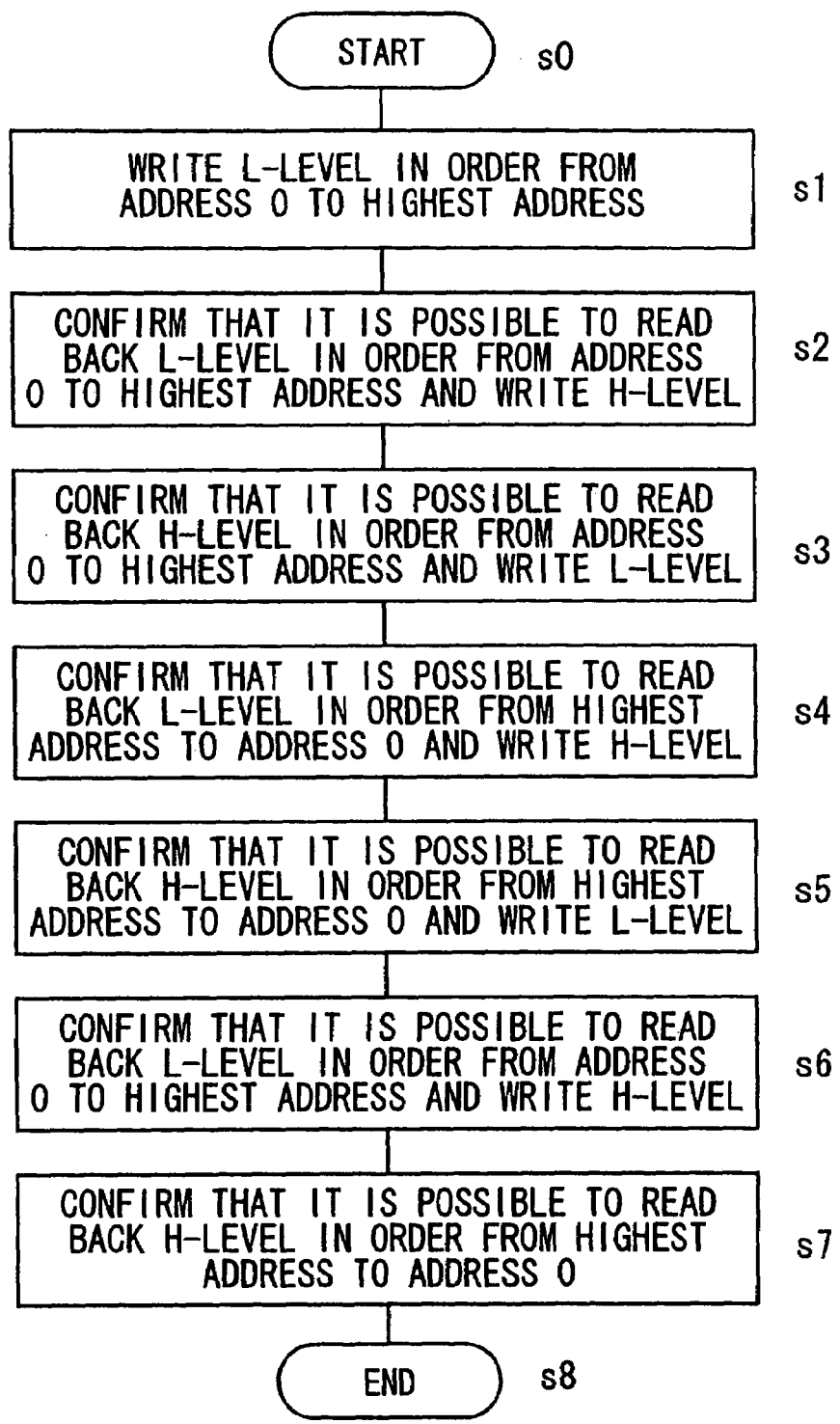

MEMORY APPARATUS

CROSS-REFERENCE TO RELATED APPLICATIONS

This application is a National Phase filing under 35 U.S.C. § 371 of International Application No. PCT/JP2004/013960 filed on Sep. 24, 2004, and which claims priority to Japanese Patent Application No. 2003-331889 filed on Sep. 24, 2003, the contents of each of which are incorporated herein by reference in their entirety.

TECHNICAL FIELD

The present invention relates to a memory chip capable of relieving a faulty part of a memory cell, as well as to a memory system including the memory chip.

BACKGROUND ART

In a memory chip, the possibility arises that due to in-process problems or others a faulty part which is unable to perform a proper storage action, namely an error bit will be developed. If an error bit, even though a single one, exists in a memory chip, the memory chip will have to be discarded as a defective item, which gives rise to a problem of deterioration in manufacturing yields.

FIG. 17 is a block diagram showing the constitution of a memory chip 1 of conventional design. This is a typical prior art practice disclosed in Japanese Unexamined Patent Publication JP-A 11-250691 (1999). The memory chip 1 disclosed in JP-A 11-250691 includes, in addition to a main memory cell 4, a row-wise redundant memory cell 2 and a column-wise redundant memory cell 3 as an excess of the storage capacity necessary for the normal operation of the memory chip 1. If an error bit exists in the main memory cell 4, the error bit will be replaced with the corresponding one of the row-wise redundant memory cell 2 and the column-wise redundant memory cell 3 to make the memory chip 1 as a whole a conforming item.

The memory chip 1 is composed of: the main memory cell 4; the row-wise redundant memory cell 2; the column-wise redundant memory cell 3; a first demultiplexer 5; a first fuse circuit 6; a second demultiplexer 7; a second fuse circuit 8; a redundant row selector 9; a redundant column selector 10; a read/write control section 11; and a redundancy execution signal terminal 12. The main memory cell 4 for storing data stores data at the intersection of two straight lines intersecting at right angles, namely a data line and a word line. The first and second demultiplexers 5 and 7 are of circuits for allowing selection of the data line and the word line in the main memory cell 4. The row-wise redundant memory cell 2 and the column-wise redundant memory cell 3 each serve as a substitute for a defective memory cell in the event of for example a break in the data line as well as the word line of the main memory cell 4.

When some data line as well as word line of the main memory cell 4 is found to be faulty during an inspection/repair process in the course of the manufacture of the memory chip, a redundancy execution signal is impressed at the redundancy execution signal terminal 12. Whereupon, the line corresponding to the data line as well as the word line to be replaced is addressed, and the corresponding value determined in the redundant row selector 9 and the redundant column selector 10 is stored. Moreover, the output from the first and second demultiplexers 5 and 7 corresponding to the data line as well as the word line to be replaced is negated by the action of the first and second fuse circuits 6 and 8 to permit of adjustment so that upon the designation of the corresponding value, a target error bit of the main memory cell 4 is brought into an inactive state. In this way, the error bit of the main memory cell 4 can be replaced with the row-wise redundant memory cell 2 as well as the column-wise redundant memory cell 3 successfully, whereby making it possible to operate the main memory cell 4 as a conforming component.

In the memory chip 1, error bits arise in the main memory cell 4 statistically in a random fashion. Since the number of error bits per memory chip ranges with a statistical probability distribution, it follows that the storage capacity of the row-wise redundant memory cell 2 as well as the column-wise redundant memory cell 3 required to accomplish a redundancy-based relief is determined in view of a tradeoff between expected yield improvements which are achieved by dint of the redundancy-based relief and an increase of the size of the memory chip 1 entailed by the addition of the row-wise redundant memory cell 2 and the column-wise redundant memory cell 3. It will thus be seen that there arises a memory chip that failed to recover through the redundancy-based relief, namely a memory chip that has to be discarded as a defective item, with certain probability.

DISCLOSURE OF THE INVENTION

An object of the invention is to provide a memory apparatus that succeeds in achieving high production yields while providing a relief not only for main memory means of its own but also for main memory means of another memory apparatus.

The invention provides a memory apparatus comprising:
main memory means;
redundant memory means for relieving a defect existing in the main memory means;
identification number storing means for storing an identification number corresponding to a main memory cell;
relief command input means to which a relief command including an identification number is inputted;
memory space severing means for severing a memory space corresponding to a defect existing in the main memory means from the main memory means so as to render the memory space inoperative; and
allocating means for allowing allocation of the redundant memory means so as for a defective memory space of the main memory means to be replaced with a memory space of the redundant memory means, wherein the allocating means is operated in such a manner that, when an identification number included in a relief command coincides with an identification number stored in the identification number storing means, a memory space corresponding to a defect existing in the main memory means specified by the relief command inputted to the relief command input means is severed from the main memory means so as to be rendered inoperative, when an identification number included in a relief command coincides with an identification number stored in the identification number storing means, a memory space corresponding to a defect existing in the main memory means specified by the relief command inputted to the relief command input means is replaced with a memory space of the redundant memory means, and when an identification number included in a relief command does not coincide with an identification number stored in the identification number storing means, a memory space corresponding to a defect existing in the main memory means of another memory apparatus specified by the relief command inputted to the relief command input means is replaced with a memory space of the redundant memory means of the memory apparatus of interest.

In the invention, it is preferable that the memory apparatus further comprises:

self-diagnostic means for checking a presence or absence of a defect in the main memory means and in the redundant memory means;

defective location storing means for storing a location of a defect existing in the main memory means;

relief information storing means for storing information on how the main memory means is repaired by the redundant memory means; and redundancy-based relief request making means for demanding that, when it is found impossible for the memory apparatus of interest to repair the main memory means thereof by using the redundant memory means of its own, said main memory means should be given a relief by another memory apparatus electrically connected to the memory apparatus of interest.

In the invention, it is preferable that the memory apparatus still further comprises:

redundancy-based relief request receiving means for receiving a relief request from the redundancy-based relief request making means of another memory apparatus, wherein the allocating means is operated in such a manner that, when there is a relief request from the redundancy-based relief request making means of another memory apparatus, a defective memory space of the main memory means of another memory apparatus is replaced with a memory space of the redundant memory means of the memory apparatus of interest.

In the invention, it is preferable that the redundancy-based relief request receiving means is capable of receiving a relief request from the redundancy-based relief request making means of each and every memory apparatus.

In the invention, it is preferable that the memory apparatus is such constituted that the other memory apparatuses is stacked on a top thereof in thickwise direction, and the redundancy-based relief request making means and the redundancy-based relief request receiving means of all the memory apparatuses are electrically connected to a common electrode formed so as to pass through all the memory apparatuses in the thicknesswise direction.

BRIEF DESCRIPTION OF THE DRAWINGS

Other and further objects, features, and advantages of the invention will be more explicit from the following detailed description taken with reference to the drawings wherein:

FIGS. 10A and 10B are views each schematically showing a redundancy-based relief signal which is impressed at a redundancy-based relief execution terminal 25;

FIG. 11 is a flow chart showing a procedure for conducting a diagnosis of a main memory cell 27 to be effected by a BIST logic 40;

BEST MODE FOR CARRYING OUT THE INVENTION

Figure 1:
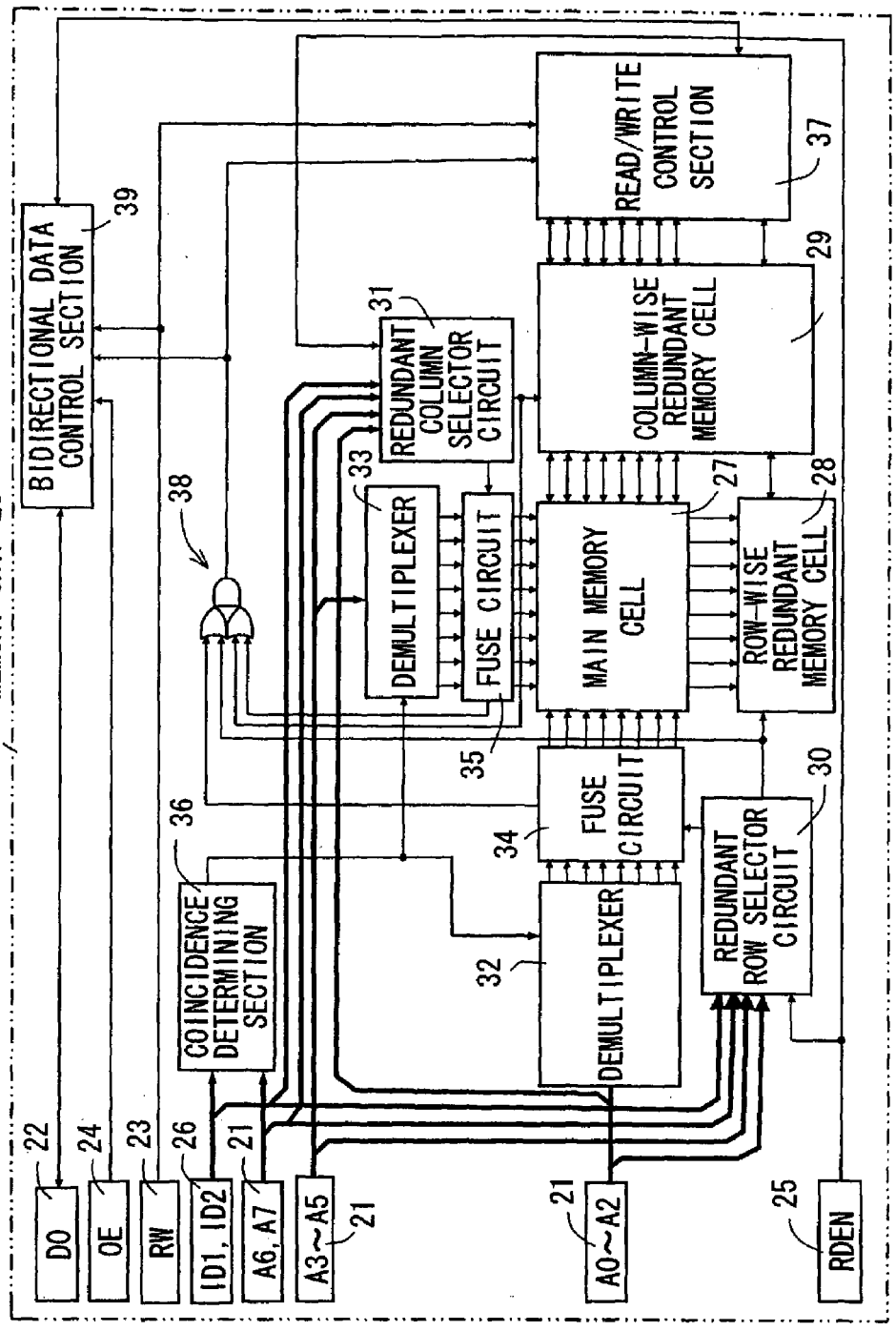
FIG. 1 is a circuit diagram schematically showing a memory chip 20 accomplished by way of a first embodiment of the invention.

Now referring to the drawings, preferred embodiments of the invention are described below.

FIG. 1 is a circuit diagram schematically showing a memory chip 20 accomplished by way of the first embodiment of the invention. In the present embodiment, the memory chip 20, namely the memory apparatus, is designed to be 64 bits in storage capacity. By preparing four pieces of the memory chips 20, 256-bit storage capacity is realized. In this construction, 1 bit is regarded as 1 word.

The memory chip 20 is provided with 8 pieces of 1-bit address terminals 21. Also disposed in the memory chip 20 are: a 1-bit data terminal 22; a read/write designation terminal 23; an output enabling terminal 24; a redundancy execution terminal 25; and a non-illustrated chip selector terminal. Of the address terminals 21, the seventh terminal and the eighth terminal act as redundancy command input means. The chip selector terminal allows selection between permission and inhibition for the operation of the chip as a whole. In addition, the memory chip 20 includes an identification number designation terminal 26 acting as identification number storing means to identify the four memory chips 20 on an individual basis.

The memory chip 20 is composed of: a main memory cell 27; a row-wise redundant memory cell 28; a column-wise redundant memory cell 29; a redundant row selector circuit 30; a redundant column selector circuit 31; a first demultiplexer 32; a second demultiplexer 33; a first fuse circuit 34;

and a second fuse circuit 35. The main memory cell 27 serves as main memory means for storing data at the intersection of a plurality of data lines and word lines intersecting at right angles. The first and second demultiplexers 32 and 33 are each of a circuit for specifying a given one of 8 lines on the basis of 3-bit addresses. For example, the first to third bits of the address are assigned to the data line extending in the row-wise direction of the main memory cell 27, and the fourth to sixth bits of the address are assigned to the word line extending in a direction perpendicular to the row-wise direction, namely the column-wise direction of the main memory cell 27. In this way, the main memory cell 27 is allowed to function as a 64-bit memory.

In the event of a break in the data line and the word line of the main memory cell 27, the main memory cell 27 incurs a defective part therearound. At this time, the redundant row selector circuit 30 as well as the redundant column selector circuit 31 serves as allocating means for specifying a data line of the row-wise redundant memory cell 28 and a word line of the column-wise redundant memory cell 29 in order to select the defective data and word lines in the main memory cell 27. In the present embodiment, the row-wise redundant memory cell 28 has a single data line array and the column-wise redundant memory cell 29 has a single word line array. However, the row-wise redundant memory cell 28 and the column-wise redundant memory cell 29 may be provided with a plurality of data lines and a plurality of word lines, respectively, in expectation of the possibility that a break will occur over a plurality of data and word lines of the main memory cell 27.

The first and second fuse circuits 34 and 35 sever the defective data and word lines of the main memory cell 27. More specifically, in response to a redundancy execution signal and a to-be-severed line selection signal from the redundant row selector circuit 30 as well as the redundant column selector circuit 31, the first and second fuse circuits 34 and 35 are driven to sever target data and word lines of the main memory cell 27. Moreover, the first and second fuse circuits 34 and 35 are provided with a terminal for outputting a signal indicating that data readout has been completed in the main memory cell 27 (not shown in the figure). The output of the terminal is adjusted to be equal to the logical OR of the total outputs of the first and second fuse circuits 34 and 35.

The memory chip 20 further includes a coincidence determining section 36 for correlating the main memory cell 27 with a predetermined 64-bit memory space out of a 256-bit memory space. For example, only in the case where the 7th bit and the 8th bit of the address agree with the identification number of the memory chip 20, the 64-bit memory space is correlated with the memory chip 20.

Figure 2:
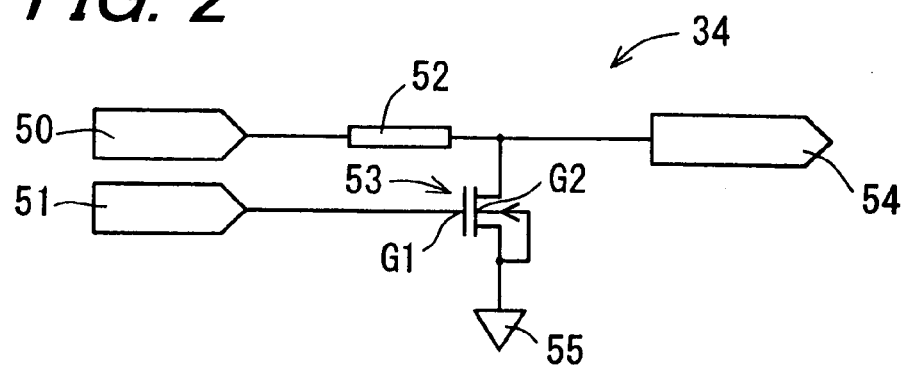
FIG. 2 is a circuit diagram showing a first example of a first fuse circuit 34.

FIG. 2 is a circuit diagram showing the first example of the first fuse circuit 34. The second fuse circuit 35 is analogous in constitution to the first fuse circuit 34, and thus the explanation therefor will be omitted. The first fuse circuit 34 is composed of: a first terminal 50; a second terminal 51; a fuse 52; a transistor 53; a third terminal 54; and a fourth terminal 55. The first terminal 50 is electrically connected to the first demultiplexer 32. The second terminal 51 is electrically connected to the redundant row selector circuit 30, so that a redundancy execution signal from the redundancy execution terminal 25 can be transmitted to the second terminal 51 through the redundant row selector circuit 30. The fuse 52 is constituted by a thin film made of, for example, polysilicon and aluminum so as to be fusion-cut at an electric current of a predetermined value or above. The transistor 53 is built as a switching element for burning the fuse 52. The third terminal 54 is electrically connected to the data line of the main memory cell 27. The fourth terminal 55 constantly receives application of a voltage of predetermined L level.

The first terminal 50, which is electrically connected to the first demultiplexer 32, is electrically connected to the fuse 52. The third terminal 54 is also electrically connected to the fuse 52. The second terminal 51 is electrically connected to the gate G1 of the transistor 53. The fuse 52 and the third terminal 54 are electrically connected to the drain of the transistor 53. The fourth terminal 55 for providing a L-level voltage is electrically connected to the source and the substrate G2 of the transistor 53.

By applying a voltage of predetermined H level which is higher than the L level to the first terminal 50, it is possible to make data-line selection. In order to sever the data line of the main memory cell 27, at the outset, a predetermined higher-than-L level H-level voltage is applied to the first terminal 50. Then, as a redundancy execution signal, a predetermined higher-than-L level H-level voltage is applied to the second terminal 51. In so doing the source and the drain of the transistor 53 are brought into a conducting state, and the transistor 53-side part of the fuse 52 stands at the L level, in consequence whereof there results a potential difference between the opposite ends of the fuse 52. In this state, the passage of an electric current through the fuse 52 leads to occurrence of a break.

Figure 3:
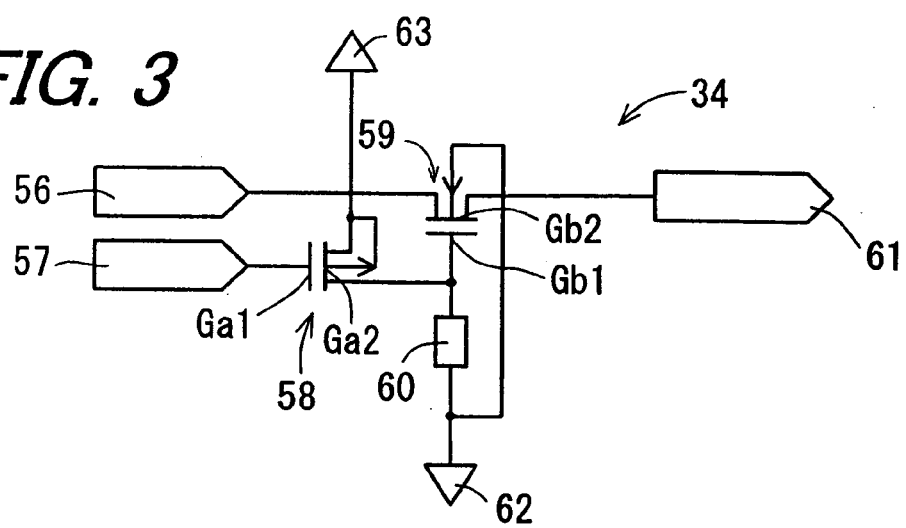
FIG. 3 is a circuit diagram showing a second example of the first fuse circuit 34.

FIG. 3 is a circuit diagram showing the second example of the first fuse circuit 34. The second fuse circuit 35 is analogous in constitution to the first fuse circuit 34, and thus the explanation therefor will be omitted. The first fuse circuit 34 is composed of: a first terminal 56; a second terminal 57; a first transistor 58; a second transistor 59; an antifuse 60; a third terminal 61; a fourth terminal 62, and a fifth terminal 63. The first terminal 56 is electrically connected to the first demultiplexer 32. The second terminal 57 is electrically connected to the redundant row selector circuit 30, so that a redundancy execution signal from the redundancy execution terminal 25 can be transmitted to the second terminal 57 through the redundant row selector circuit 30.

The first transistor 58 is built as a switching element for developing a short circuit in the antifuse 60. The second transistor 59 is built as a switching element for effecting switching of the electrical connection between the first terminal 56 and the third terminal 61. The polysilicon-made antifuse 60 is initially kept in a high-impedance state. Upon the passage of an electric current of predetermined level, the polysilicon is melted into amorphous, whereupon the antifuse 60 is short-circuited. The third terminal 61 is electrically connected to the data line of the main memory cell 27. The fourth terminal 62 constantly receives application of a voltage of predetermined L level. The fifth terminal 63 constantly receives application of a voltage for short-circuiting the antifuse 60.

The first terminal 56 is electrically connected to the source of the second transistor 59. The second terminal 57 is electrically connected to the gate Ga 1 of the first transistor 58. The antifuse 60 has its one end electrically connected to the drain of the first transistor 58 and the gate Gb 1 of the second transistor 59, and has its other end electrically connected to the fourth terminal 62 for providing a L-level voltage. The third terminal 61 is electrically connected to the drain of the second transistor 59. The substrate Gb 2 of the second transistor 59 is electrically connected to the fourth terminal 62 for providing a L-level voltage. The fifth terminal 63 for providing a H-level voltage is electrically connected to the source of the first transistor 58 and the substrate Ga 2 of the first transistor 58. Note that the source and the drain of the second transistor 59 are structurally equivalent and undistinguishable, and therefore the portion to be connected to the first terminal 56 is defined as the source, whereas the portion to be connected to the third terminal 61 is defined as the drain, for the sake of convenience in illustrating the invention.

In the absence of a redundancy execution signal in the second terminal 57, a slight leakage current is passing through the first transistor 58. Since the antifuse 60 is out of conduction, it follows that the gate Gb 1 of the second transistor 59 stands at the H level, and the source and the drain of the second transistor 59 are brought into a state of conductivity. Eventually, the first terminal 56 and the third terminal 61 become conductive so as to effect data-line selection.

In order to sever the data line of the main memory cell 27, at the outset, as a redundancy execution signal, a H-level voltage is applied to the second terminal 57. This brings the source and the drain of the first transistor 58 into conduction, and thereby the fourth terminal 62 to which a L-level voltage is applied and the fifth terminal 63 that provides a H-level voltage become conductive through the antifuse 60. Subsequently, an electric current is provided through the fifth terminal 63 to develop a short circuit in the antifuse 60. With the antifuse 60 short-circuited, the gate Gb 1 of the second transistor 59 receives application of a L-level voltage from the fourth terminal 62 to which the L-level voltage is applied, thereby bringing the source and the drain of the second transistor 59 out of conduction.

Figures 4, 5A, 5B:
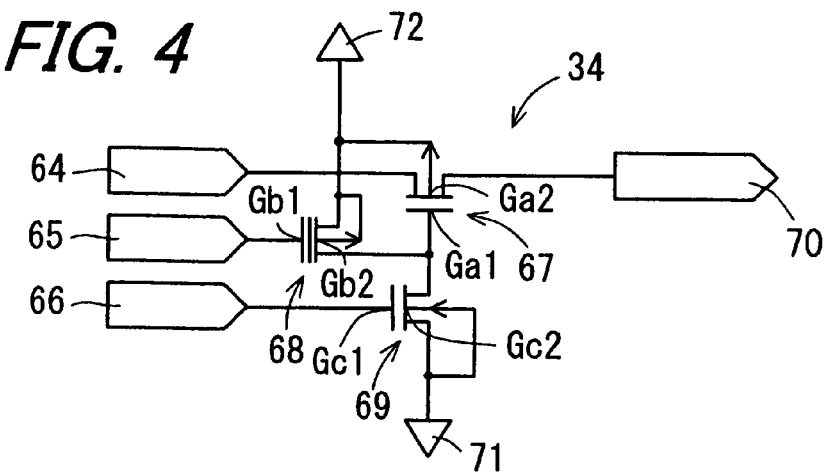
FIG. 4 is a circuit diagram showing a third example of the first fuse circuit 34.
FIGS. 5A and 5B are views each schematically showing a redundancy-based relief signal which is impressed at a redundancy-based relief execution terminal 25.

FIG. 4 is a circuit diagram showing the third example of the first fuse circuit 34. The second fuse circuit 35 is analogous in constitution to the first fuse circuit 34, and thus the explanation therefor will be omitted. The first fuse circuit 34 is composed of: a first terminal 64; a second terminal 65; a third terminal 66; a first transistor 67; a second transistor 68; a third transistor 69; a fourth terminal 70; a fifth terminal 71; and a sixth terminal 72. The first terminal 64 is electrically connected to the first demultiplexer 32. The second terminal 65 is electrically connected to the redundant row selector circuit 30, so that a redundancy execution signal of predetermined L level from the redundancy execution terminal 25 can be transmitted to the second terminal 65 through the redundant row selector circuit 30. The third terminal 66 is electrically connected to the redundant row selector circuit 30, so that a redundancy execution signal of predetermined H level from the redundancy execution terminal 25 can be transmitted to the third terminal 66 through the redundant row selector circuit 30.

The first transistor 67 is built as a switching element for effecting switching of the electrical connection between the first terminal 64 and the fourth terminal 70. The second transistor 68 is realized by the use of a MOS transistor having a floating gate. The third transistor 69 is built as a switching element for implanting a hot electron in the second transistor 68. The fourth terminal 70 is electrically connected to the data line of the main memory cell 27. The fifth terminal 71 is electrically connected to a source of supply for the hot electron to be implanted in the second transistor 68. The fifth terminal 71 constantly receives application of a voltage of H level. The sixth terminal 72 constantly receives application of a voltage of H level.

The first terminal 64 is electrically connected to the source of the first transistor 67. The second terminal 65 is electrically connected to the gate Gb 1 of the second transistor 68. The third terminal 66 is electrically connected to the gate Gc 1 of the third transistor 69. The fourth terminal 70 is electrically connected to the drain of the first transistor 67. The fifth terminal 71, to which a L-level voltage is applied, is electrically connected to the source of the third transistor 69 and the substrate Gc 2 of the third transistor 69. The sixth terminal 72 serves to provide a voltage of high level for implanting the hot electron in the floating gate. The sixth terminal 72 is electrically connected to the substrate Ga 2 of the first transistor 67, the source of the second transistor 68, and the substrate Gb 2 of the second transistor 68. The gate Ga 1 of the first transistor 67 is electrically connected to the drain of the second transistor 68 and the drain of the third transistor 69. Note that the source and the drain of the first transistor 67 are structurally equivalent and undistinguishable, and therefore the portion to be connected to the first terminal 64 is defined as the source, whereas the portion to be connected to the fourth terminal 70 is defined as the drain, for the sake of convenience in illustrating the invention.

In the second transistor 68, the region between the drain and the source is kept in a high-impedance state until the hot electron is implanted therein. In the absence of a redundancy execution signal of H level in the second terminal 65, a slight leakage current is passing through the third transistor 69, and the gate Ga 1 of the first transistor 67 stands at the L level. In this case, the source and the drain of the first transistor 67 are brought into a state of conductivity.

In order to sever the data line of the main memory cell 27, at the outset, a redundancy execution signal of H level is impressed at the third terminal 66, wherefore the third terminal 66 receives application of a H-level voltage. This brings the source and the drain of the third transistor 69 into conduction, and thereby the hot electron from the fifth terminal 71 is implanted, through the source and drain channel of the second transistor 68, into the floating gate. Upon completion of the implantation of the hot electron in the floating gate of the second transistor 68, a short circuit is developed between the source and the drain of the second transistor 68. With the region between the source and the drain of the second transistor 68 short-circuited, the gate Ga 1 of the first transistor 67 stands at the H level, thereby bringing the source and the drain out of conduction.

FIGS. 5A and 5B are views each schematically showing a redundancy-based relief signal which is impressed at the redundancy execution terminal 25. In this example, the redundancy-based relief signal is represented as parallel data using address lines. When a redundancy-based relief command RDEN stands at the H level, as shown in FIG. 5A, the first to third bits of the redundancy-based relief signal represent a row (column)-wise redundant resistor value; the fourth bit represents a row or a column; the fifth and sixth bits represent a command number; and the seventh and eighth bits represent an identification number. When the third bit of the H-level redundancy-based relief signal represents a row, the row of the main memory cell 27, namely the data line, is subjected to a redundancy-based relief. At this time, when the fifth bit represents 1 and the sixth bit represents 0, a redundancy command 1 is indicated. Moreover, when the third bit of the H-level redundancy-based relief signal represents a column, the column of the main memory cell 27, namely the word line, is subjected to a redundancy-based relief. At this time, when the fifth bit represents 0 and the sixth bit represents 1, a redundancy command 2 is indicated. Both the redundancy command 1 and the redundancy command 2 will be described later on.

On the other hand, when the redundancy-based relief command RDEN stands at the L level, the memory is allowed to function normally. As shown in FIG. 5B, the first to sixth bits represent an address, and the seventh and eighth bits represent an identification number. Although, in FIGS. 5A and 5B, the redundancy-based relief signal is taken as parallel data using address lines, it may be taken as serial data with allocation of fewer input lines.

For example, let it be assumed that a redundancy-based relief command is issued by utilizing a JTAG (Joint Test Action Group) function that is designed to diagnose the operating conditions of a memory chip system or the like, such as I/O-circuit connection. In this case, a JTAG instruction is issued, at a timing of a clock provided by a TCK terminal, by using a TMS terminal that is common to all apparatuses incorporating the JTAG function to which it is connected. In response to the JTAG instruction, as serial data, detailed data is provided through a TDI input terminal. The TDI terminal for providing data constitutes a shift register inside, and, when the inner register length is exceeded, the excess of data is re-sent through a TDO output out. In general, the TDO output is connected (daisy-chain connected) to the TDL terminal of another downstream-side JTAG-functional apparatus, whereby making it possible to impart data to all of the JTAG-functional apparatuses on an individual basis. Since the JTAG instruction has room to provide a user-definable undefined command, it is possible to configure part of the undefined command so as to provide the redundancy-based relief command as data. In this way, the redundancy-based relief command can be inputted to the relief command input means through the data register of the JTAG function.

By the same token, by configuring part of the undefined command so as to provide an identification number as data, it is possible to provide the identification number of the memory apparatus as data.

Figure 6:
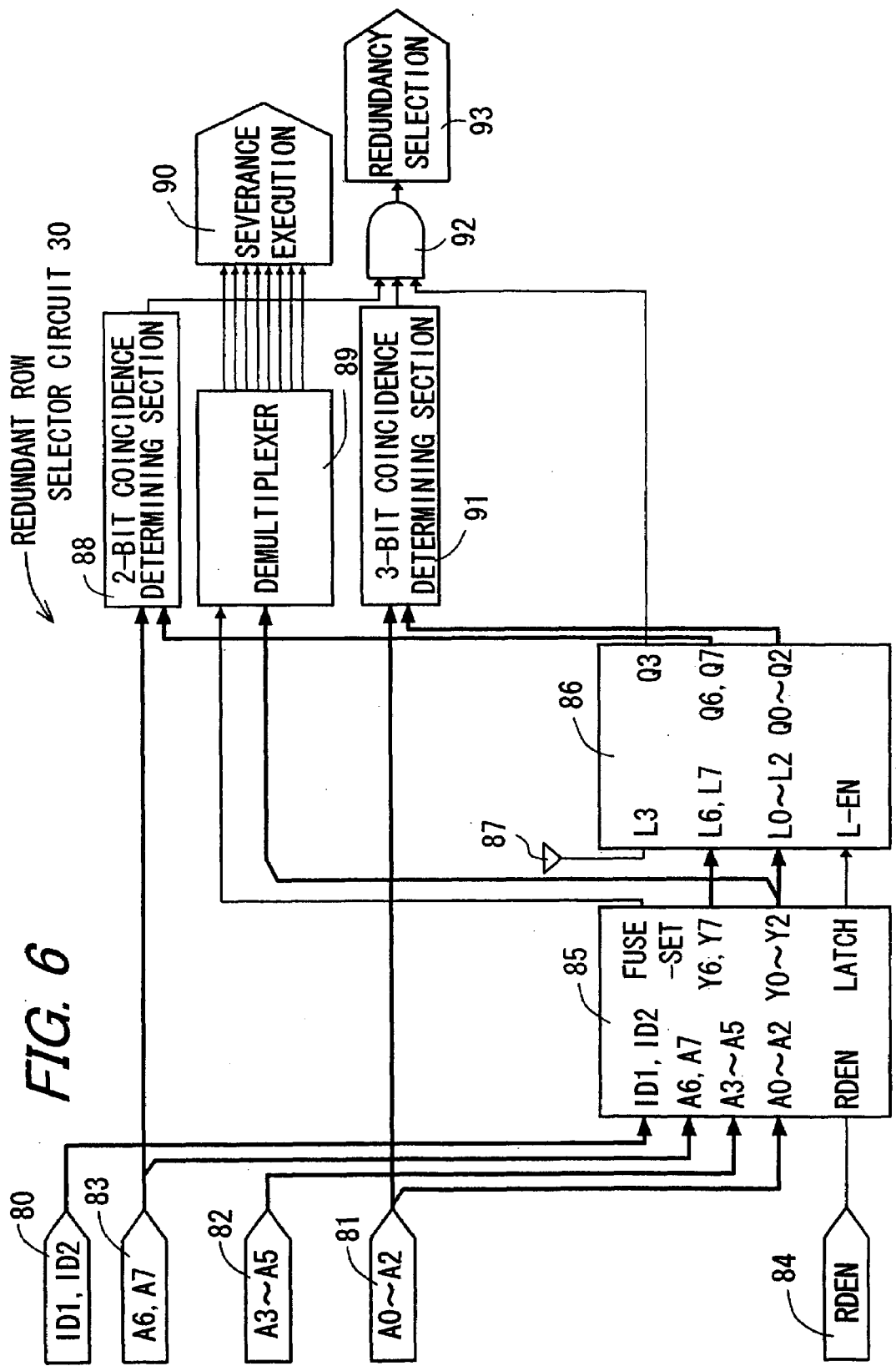
FIG. 6 is a circuit diagram schematically showing a redundant row selector circuit 30.

FIG. 6 is a circuit diagram schematically showing the redundant row selector circuit 30. The redundant column selector circuit 31 is analogous in constitution to the redundant row selector circuit 30, and thus the detailed explanation therefor will be omitted. The redundant row selector circuit 30 is composed of: a first input terminal 80; a second input terminal 81; a third input terminal 82; a fourth input terminal 83; a fifth input terminal 84; a redundancy-based relief command decoder circuit 85; a memory circuit 86; a sixth input terminal 87; a 2-bit coincidence determining section 88; a demultiplexer 89; a first output terminal 90; a 3-bit coincidence determining section 91; an AND circuit 92; and a second output terminal 93. The first to fifth input terminals 80 to 84 are electrically connected to the redundancy-based relief command decoder circuit 85. Of these input terminals, the second input terminal 81 is electrically connected also to the 3-bit coincidence determining section 91, and the fourth input terminal 83 is electrically connected also to the 2-bit coincidence determining section 88. The first output terminal 90 is electrically connected to the first fuse circuit 34. The second output terminal 93 is electrically connected to the row-wise redundant memory cell 28.

In the redundancy-based relief command decoder circuit 85, a FUSE-SET terminal is electrically connected to the demultiplexer 89. A LATCH terminal is electrically connected to a L-EN terminal disposed in the memory circuit 86. A Y0 to Y2 terminal is electrically connected to a L0 to L2 terminal disposed in the memory circuit 86, as well as to the demultiplexer 89. A Y6, Y7 terminal is electrically connected to a L6, L7 terminal disposed in the memory circuit 86. The sixth input terminal 87, to which a voltage of predetermined H level is constantly applied, is electrically connected to a L3 terminal disposed in the memory circuit 86. In the memory circuit 86, A Q0 to Q2 terminal is electrically connected to the 3-bit coincidence determining section 91. A Q3 terminal is electrically connected to the AND circuit 92. A Q6, Q7 terminal is electrically connected to the 2-bit coincidence determining section 88. The 2-bit coincidence determining section 88 is electrically connected to the AND circuit 92. The demultiplexer 89 is electrically connected to the first output terminal 90. The 3-bit coincidence determining section 91 is electrically connected to the AND circuit 92. The AND circuit 92 is electrically connected to the second output terminal 93.

Figure 7:
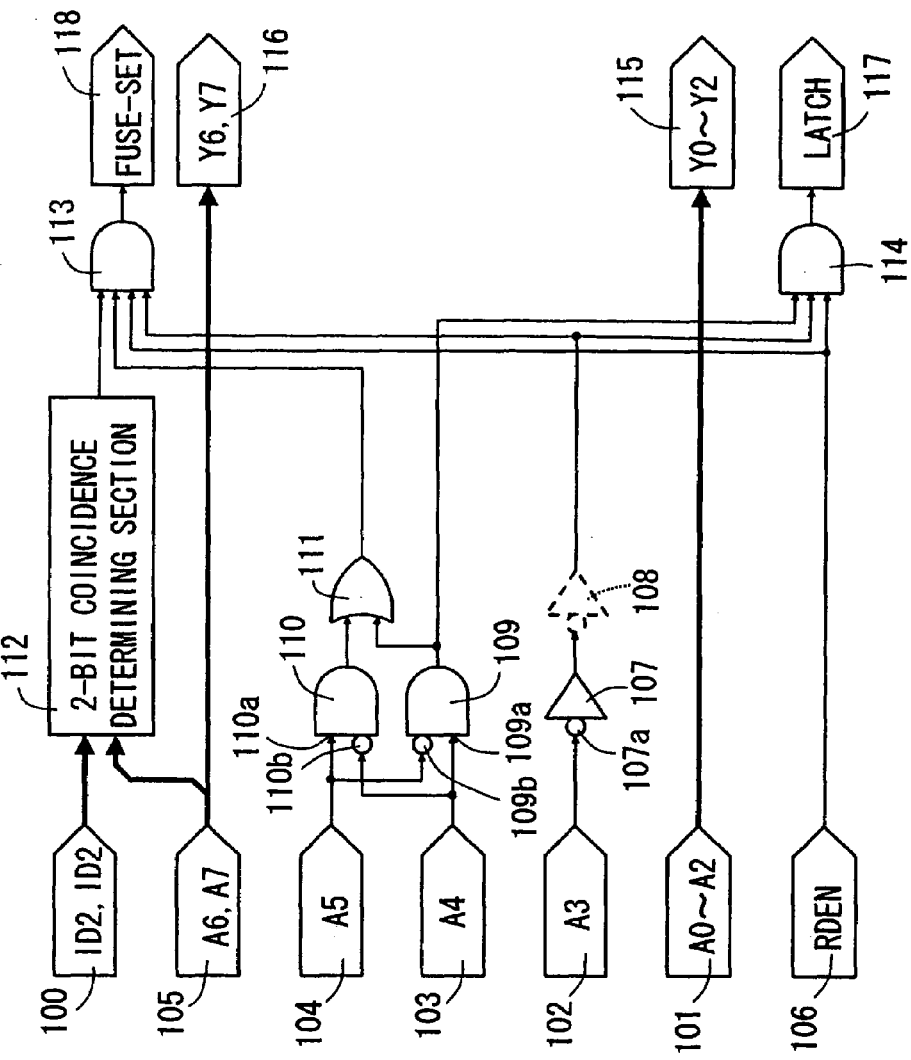
FIG. 7 is a circuit diagram schematically showing a redundancy-based relief command decoder circuit 85.

FIG. 7 is a circuit diagram schematically showing the redundancy-based relief command decoder circuit 85. The redundancy-based relief command decoder circuit 85 is composed of: a first input terminal 100; a second input terminal 101; a third input terminal 102; a fourth input terminal 103; a fifth input terminal 104; a sixth input terminal 105; a seventh input terminal 106; an inverter gate 107; a first AND circuit 109; a second AND circuit 110; an OR circuit 111; a 2-bit coincidence determining section 112; a third AND circuit 113; a fourth AND circuit 114; a first output terminal 115; a second output terminal 116; a third output terminal 117; and a fourth output terminal 118.

In the redundancy-based relief command decoder circuit 85, the first input terminal 100 is electrically connected to the first input terminal 80 of the redundant row selector circuit 30. The second input terminal 101 is electrically connected to the second input terminal 81 of the redundant row selector circuit 30. The third to fifth input terminals 102 to 104 are electrically connected to the third input terminal 82 of the redundant row selector circuit 30. The sixth input terminal 105 is electrically connected to the fourth input terminal 83 of the redundant row selector circuit 30. The seventh input terminal 106 is electrically connected to the fifth input terminal 84 of the redundant row selector circuit 30. In the redundancy-based relief command decoder circuit 85, the first input terminal 100 and the sixth input terminal 105 are electrically connected to the 2-bit coincidence determining section 112. The second input terminal 101 is electrically connected to the first output terminal (Y0 to Y2 terminal) 115. The third input terminal 102 is electrically connected to the negative logic 107a of the inverter gate 107. In the negative logic 107a, a logically true value is given as "1", whereas a logically false value is given as "0". The inverter gate 107 is electrically connected to the third AND circuit 113 and the fourth AND circuit 114.

The fourth input terminal 103 is electrically connected to the positive logic 109a of the first AND circuit 109 and the negative logic 110b of the second AND circuit 110. The fifth input terminal 104 is electrically connected to the positive logic 110a of the second AND circuit 110 and the negative logic 109b of the first AND circuit 109. In the positive logic 109a of the first AND circuit 109 and the positive logic 110a of the second AND circuit 110, a logically true value is given as "0", whereas a logically false value is given as "1". On the other hand, in the negative logic 109b of the first AND circuit 109 and the negative logical 110b of the second AND circuit 110, a logically true value is given as "1", whereas a logically false value is given as "0". The first AND circuit 109 is electrically connected to the OR circuit 111 and the fourth AND circuit 114. The second AND circuit 110 is electrically connected to the OR circuit 111. The OR circuit 111 is electrically connected to the third AND circuit 113.

The sixth input terminal 105 is electrically connected to the 2-bit coincidence determining section 112 and the second output terminal (Y6, Y7 terminal) 116. The seventh input terminal 106 is electrically connected to the third AND circuit 113 and the fourth AND circuit 114. The 2-bit coincidence determining section 112 is electrically connected to the third AND circuit 113. The third AND circuit 113 is electrically connected to the fourth output terminal (FUSE-SET terminal) 118. The fourth AND circuit 114 is electrically connected to the third output terminal (LATCH terminal) 117.

The first output terminal 115 is electrically connected to the L0 to L2 terminal of the memory circuit 86, as well as to the demultiplexer 89, of the redundant row selector circuit 30. The second output terminal 116 is electrically connected to the L6, L7 terminal of the memory circuit 86 of the redundant row selector circuit 30. The third output terminal 117 is electrically connected to the L-EN terminal of the memory circuit 86 of the redundant row selector circuit 30. The fourth output terminal 118 is electrically connected to the demultiplexer 89 of the redundant row selector circuit 30.

A FUSE-SET command triggers a severance action. When it is determined by the 2-bit coincidence determining section 112 that the identification number from the first input terminal 100 coincides with the identification number from the sixth input terminal 105 expressed by the seventh and eighth bits of the redundancy-based relief command (refer to FIG. 5A), then the FUSE-SET command is set on the basis of a redundancy command specified in terms of a command number (refer to FIG. 5A) by the fourth input terminal 103 and the fifth input terminal 104 expressed by the fifth and sixth bits of the redundancy-based relief command and a row-or-column designation (refer to FIG. 5A) from the third input terminal 102 expressed by the fourth bit of the redundancy-based relief command. When the redundancy-based relief execution command RDEN from the seventh input terminal 106 stands at the H level, the FUSE-SET command is outputted from the fourth output terminal 118 to the demultiplexer 89 of the redundant row selector circuit 30.

A LATCH signal acts as a redundancy-address memory signal. Under the conditions that the redundancy command specified in terms of a command number (refer to FIG. 5A) by the fourth input terminal 103 and the fifth input terminal 104 expressed by the fifth and sixth bits of the redundancy-based relief command stands at the H level in the first AND circuit 109, that there is a match of the row-or-column designation (refer to FIG. 5A) from the third input terminal 102 expressed by the fourth bit of the redundancy-based relief command, and that the redundancy-based relief execution command RDEN from the seventh input terminal 106 stands at the H level, then the LATCH signal is outputted from the third output terminal 117 to the L-EN terminal of the memory circuit 86 of the redundant row selector circuit 30. As a relief address pattern, according to the redundancy-based relief command as shown in FIG. 5A, the first to third bits and the seventh and eighth bits are stored in the memory circuit 86 of the redundant row selector circuit 30.

Note that the redundancy-based relief command decoder circuit of the redundant column selector circuit 31 is realized by providing, as indicated by a broken line 108 in FIG. 7, an additional inverter gate which is similar to the inverter gate 107 in the region between the inverter gate 107 and the third and fourth AND circuits 113 and 114 of the redundancy-based relief command decoder circuit 85 of the redundant row selector circuit 30.

Referring to FIG. 6 once again, the Q0 to Q2 terminal of the memory circuit 86, acting as defective location storing means as well as relief information storing means, is electrically connected to the 3-bit coincidence determining section 91. The Q3 terminal of the memory circuit 86 is electrically connected to the AND circuit 92. The Q6, Q7 terminal of the memory circuit 86 is electrically connected to the 2-bit coincidence determining section 88. The memory circuit 86 has a storage capacity of 6 bits. The conditions of the L0 to L2 terminal, the L3 terminal, and the L6, L7 terminal as observed when the L-EN terminal stands at the H level are stored in the memory circuit 86. The stored data is outputted from the Q0 to Q2 terminal, the Q3 terminal, and the Q6, Q7 terminal. As an initial state, the Q3 terminal stands at the L level, and the L3 terminal is brought into the H-level state by the sixth input terminal 87. In this way, until the L-EN terminal is brought into the H-level state, the Q3 terminal is kept in the L-level state, wherefore the row-wise redundant memory cell 28 is left unselected. That is, whether the row-wise redundant memory cell is used or not can be checked by observing the condition of the Q3 terminal.

Referring to FIG. 1 once again, of the address terminals 21 of the memory chip 20, the one to which the first to third bits are inputted is electrically connected to the redundant row selector circuit 30, the redundant column selector circuit 31, and the first demultiplexer 32. Of the address terminals 21 of the memory chip 20, the one to which the fourth to sixth bits are inputted for constituting redundancy-based relief request receiving means is electrically connected to the redundant row selector circuit 30, the redundant column selector circuit 31, and the second demultiplexer 33. Of the address terminals 21 of the memory chip 20, the one to which the seventh and eighth bits are inputted for constituting an identification number designation terminal is electrically connected to the redundant row selector circuit 30, the redundant column selector circuit 31, and the coincidence determining section 36. The data terminal 22 is electrically connected to a bidirectional data control section 39 which will be described later on. The read/write designation terminal 23 is electrically connected to the bidirectional data control section 39 and a read/write control section 37 which will be described later on. The output enabling terminal 24 is electrically connected to the bidirectional data control section 39. The redundancy execution terminal 25 is electrically connected to the redundant row selector circuit 30 and the redundant column selector circuit 31. The identification number designation terminal 26 is electrically connected to the redundant row selector circuit 30, the redundant column selector circuit 31, and the coincidence determining section 36.

The redundant row selector circuit 30 is electrically connected to the row-wise redundant memory cell 28, the first fuse circuit 34, and one of the OR circuits of an AND-OR gate 38 which will be described later on. The redundant column selector circuit 31 is electrically connected to the column-wise redundant memory cell 29, the second fuse circuit 35, and the other of the OR circuits of the AND-OR gate 38. The first demultiplexer 32 is electrically connected to the first fuse circuit 34. The second demultiplexer 33 is electrically connected to the second fuse circuit 35. The first fuse circuit 34 is electrically connected to the main memory cell 27 and the one OR circuit of the AND-OR gate 38. The second fuse circuit 35 is electrically connected to the main memory cell 27 and the other OR circuit of the AND-OR gate 38.

The coincidence determining section 36 is electrically connected to the first demultiplexer 32 and the second demultiplexer 33. The read/write control section 37 is electrically connected to the row-wise redundant memory cell 28, the column-wise redundant memory cell 29, and the bidirectional data control section 39. Moreover, an AND circuit is electrically connected to the two OR circuits of the AND-OR circuit 38. This AND circuit is electrically connected to the read/write control section 37 and the bidirectional data control section 39.

Now, redundancy-based relief modes will be described with reference to FIGS. 1, 5, 6, and 7. Firstly, when the redundancy-based relief command RDEN (refer to FIG. 5A) which is inputted to the redundancy execution terminal 25 of the memory chip 20 is brought into the H-level state, in response to the relief command 1 specified by the fifth bit (=1) and the sixth bit (=0) of the redundancy-based relief signal, if the identification number specified by the sixth and seventh bits of the redundancy-based relief signal coincides with the identification number stored in the identification number designation terminal 26, as one of the values to be given to the 3-bit coincidence determining section 91 of the redundant row selector circuit 30 (refer to FIG. 6) or the redundant column selector circuit 31, the first to third bits of the redundancy-based relief signal will be stored in the memory circuit 86a. In this case, the ID-number match signifies that the memory chip 20 repairs the main memory cell 27 thereof on its own. Accordingly, a severance execution signal is fed from the first output terminal 115 of the redundant row selector circuit 30 or the redundant column selector circuit 31 to the first fuse circuit 34 or the second fuse circuit 35 to sever the defective word or data line. Secondly, if the identification number specified by the sixth and seventh bits of the redundancy-based relief signal does not coincide with the identification number stored in the identification number designation terminal 26, although the first to third bits of the redundancy-based relief signal will be stored in the memory circuit 86 as one of the values to be given to the 3-bit coincidence determining section 91 of the redundant row selector circuit 30 or the redundant column selector circuit 31, in this case, the ID-number mismatch signifies that the memory chip 20 repairs the main memory cell 27 of another memory chip 20. Accordingly, no severance execution signal is impressed at the first fuse circuit 34 or the second fuse circuit 35.

Lastly, when the redundancy-based relief command RDEN which is inputted to the redundancy execution terminal 25 of the memory chip 20 is brought into the H-level state, in response to the relief command 2 specified by the fifth bit (=0) and the sixth bit (=1) of the redundancy-based relief signal, if the identification number specified by the sixth and seventh bits of the redundancy-based relief signal coincides with the identification number stored in the identification number designation terminal 26, the ID-number match signifies that the memory chip 20 has its main memory cell 27 repaired by another memory chip 20. Accordingly, a severance execution signal is fed from the first output terminal 115 of the redundant row selector circuit 30 or the redundant column selector circuit 31 to the first fuse circuit 34 or the second fuse circuit 35 to sever the defective word line. At this time, no relevant data is stored in the memory circuit 86 of the redundant row selector circuit 30.

In the first case where the memory chip 20 repairs the main memory cell 27 thereof by using the row-wise redundant memory cell 28 as well as the column-wise redundant memory cell 29 of its own, the process is so adjusted that the defective word and data lines in the main memory cell 27 are left unselected, and the address of a memory space corresponding to the defective word and data lines is stored in each of the memory circuits 86 of the redundant row selector circuit 30 and the redundant column selector circuit 31 so as for the memory space to be replaced with a corresponding memory space of the row-wise redundant memory cell 28 as well as the column-wise redundant memory cell 29. The access to the defective location in the main memory cell is effected with respect to the selected row-wise redundant memory cell 28 and column-wise redundant memory cell 29 under the control of the read/write control section 37 of the memory cell 20.

In the next case where the memory chip 20 repairs the main memory cell 27 of another memory chip 20 by using the row-wise redundant memory cell 28 as well as the column-wise redundant memory cell 29 of its own, the main memory cell 27 of the memory chip 20 of interest is not subjected to a word and data line severance process. At this time, the address of the defective memory space in another memory chip 20 having the defective main memory cell 27 and the identification number of the memory chip 20 of interest are stored in the memory circuit 86 of the redundant row selector circuit 30 as well as the redundant column selector circuit 31. The redundant row selector circuit 30 as well as the redundant column selector circuit 31 is also provided with the identification number included in the redundancy-based relief signal. Upon determination of the address of a memory space corresponding to the identification number and the address of the defective memory space in the main memory cell 27, the redundant row selector circuit 30 as well as the redundant column selector circuit 31 is operated to select the row-wise redundant memory cell 28 as well as the column-wise redundant memory cell 29. Correspondingly, a signal indicating that the selection of the row-wise redundant memory cell as well as and the column-wise redundant memory cell 29 is made by the redundant row selector circuit 30 as well as the redundant column selector circuit 31 is impressed at the read/write control section 37 and the bidirectional data control section 39 by way of the AND-OR gate 38 of the memory chip 20. This allows, as a normal operation, the memory chip 20 to have access to the selected row-wise redundant memory cell 28 as well as column-wise redundant memory cell 29. Note that, in this case, since the target of a relief is the defect of another memory chip 20, it follows that there is an ID-number mismatch and the main memory cell 27 is kept inoperative, thus avoiding any inconvenience to data access.

In the last case where the memory chip 20 has its main memory cell 27 repaired by another memory chip 20, although the defective word and data lines in the main memory cell 27 are left unselected, no relevant data is stored in the memory circuit 86 of the redundant row selector circuit 30. In this way, the address of the defective memory space in the main memory cell 27, although it is specified, is inhibited from being selected by the first fuse circuit 34 as well as the second fuse circuit 35. Accordingly, the AND-OR gate 38 is not activated, wherefore the read/write control section 37 and the bidirectional data control section 39 are out of operation. As a result, another memory chip 20 is able to perform a defect relief without hindrance.

Figure 8:
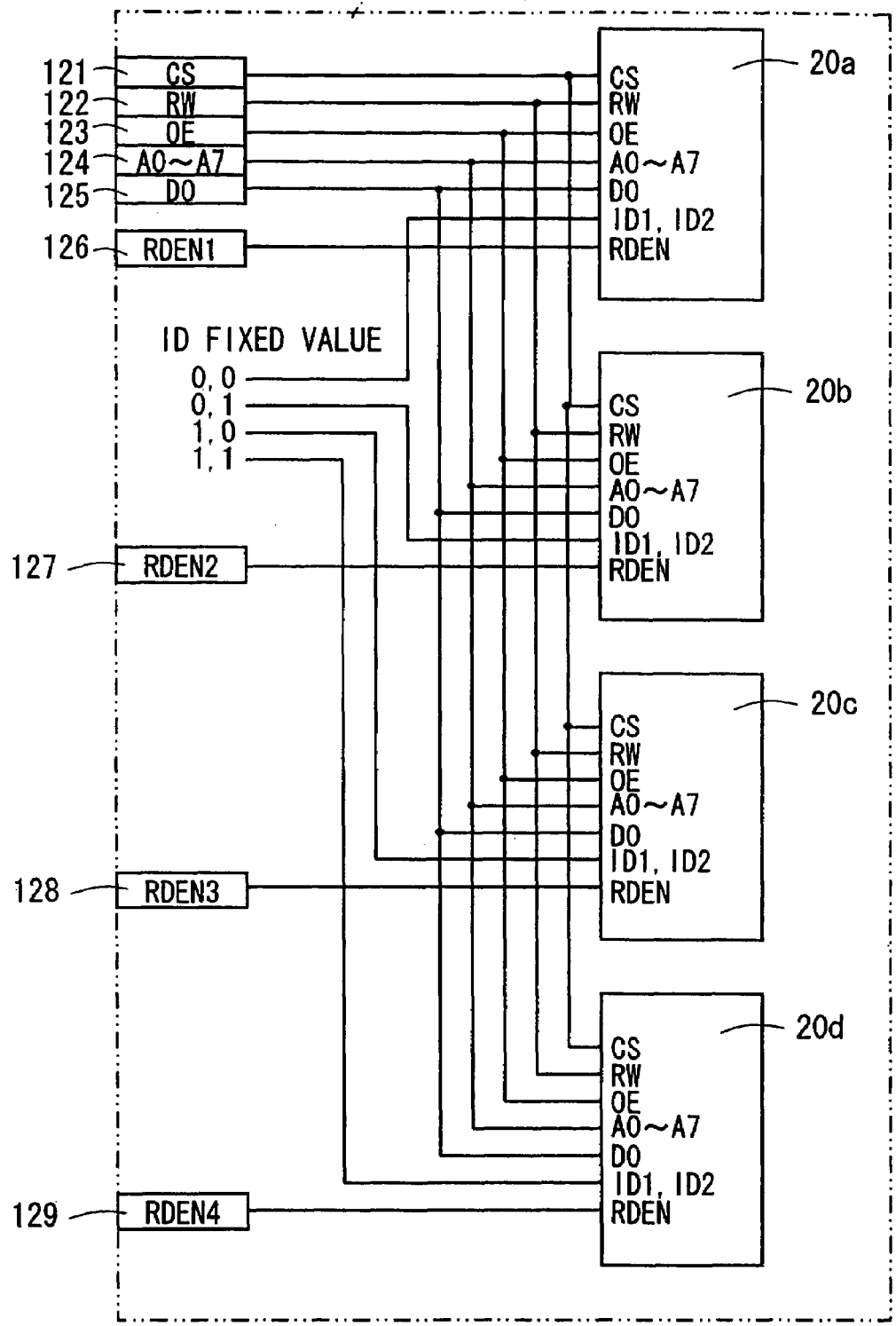
FIG. 8 is a circuit diagram schematically showing a memory system 120 incorporating four pieces of the memory chips 20.

FIG. 8 is a circuit diagram schematically showing a memory system 120 incorporating four pieces of the memory chips 20. Specifically, the memory system 120 is composed of: a first memory chip 20a; a second memory chip 20b; a third memory chip 20c; and a fourth memory chip 20d. These memory chips 20a through 20d have basically the same structure as the memory chip 20 thus far described. Also included in the memory system 120 are: a chip selector terminal 121; a read/write designation terminal 122; an output enabling terminal 123; an address terminal 124; a data terminal 125; a first relief request terminal 126; a second relief request terminal 127; a third relief request terminal 128; and a fourth relief request terminal 129.

The chip selector terminal 121 of the memory system 120 is electrically connected to the chip selector terminals of the first to fourth memory chips 20a to 20d. The read/write designation terminal 122 of the memory system 120 is electrically connected to the read/write designation terminals 23 (refer to FIG. 1) of the first to fourth memory chips 20a to 20d. The output enabling terminal 123 of the memory system 120 is electrically connected to the output enabling terminals 24 (refer to FIG. 1) of the first to fourth memory chips 20a to 20d. The address terminal 124 of the memory system 120 is electrically connected to the read/write address terminals 21 (refer to FIG. 1) of the first to fourth memory chips 20a to 20d. The data terminal 125 of the memory system 120 is electrically connected to the data terminals 22 (refer to FIG. 1) of the first to fourth memory chips 20a to 20d.

In the memory system 120, further, the first relief request terminal 126 is electrically connected to the redundancy execution terminal 25 of the first memory chip 20a. The second relief request terminal 127 is electrically connected to the redundancy execution terminal 25 of the second memory chip 20b. The third relief request terminal 128 is electrically connected to the redundancy execution terminal 25 of the third memory chip 20c. The fourth relief request terminal 129 is electrically connected to the redundancy execution terminal 25 of the fourth memory chip 20d. The first to fourth memory chips 20a to 20d are each assigned a fixed identification number in advance. For example, the identification number of the first memory chip 20a is given as (0, 0); the identification number of the second memory chip 20b is given as (0, 1); the identification number of the third memory chip 20c is given as (1, 0); and the identification number of the fourth memory chip 20d is given as (1, 1). These values can be individually stored in the corresponding identification number designation terminals 26 of the first to fourth memory chips 20a to 20d.

In the case of employing the JTAG (Joint Test Action Group) function that is designed to diagnose the operating conditions of a memory chip system, such as I/O-circuit connection or memory chip-to-memory chip connection, the capability of designating the identification number of the memory chip 20 and the redundancy-based relief command as well can be programmed as part of the JTAG instruction of the JTAG function.

Figure 9:
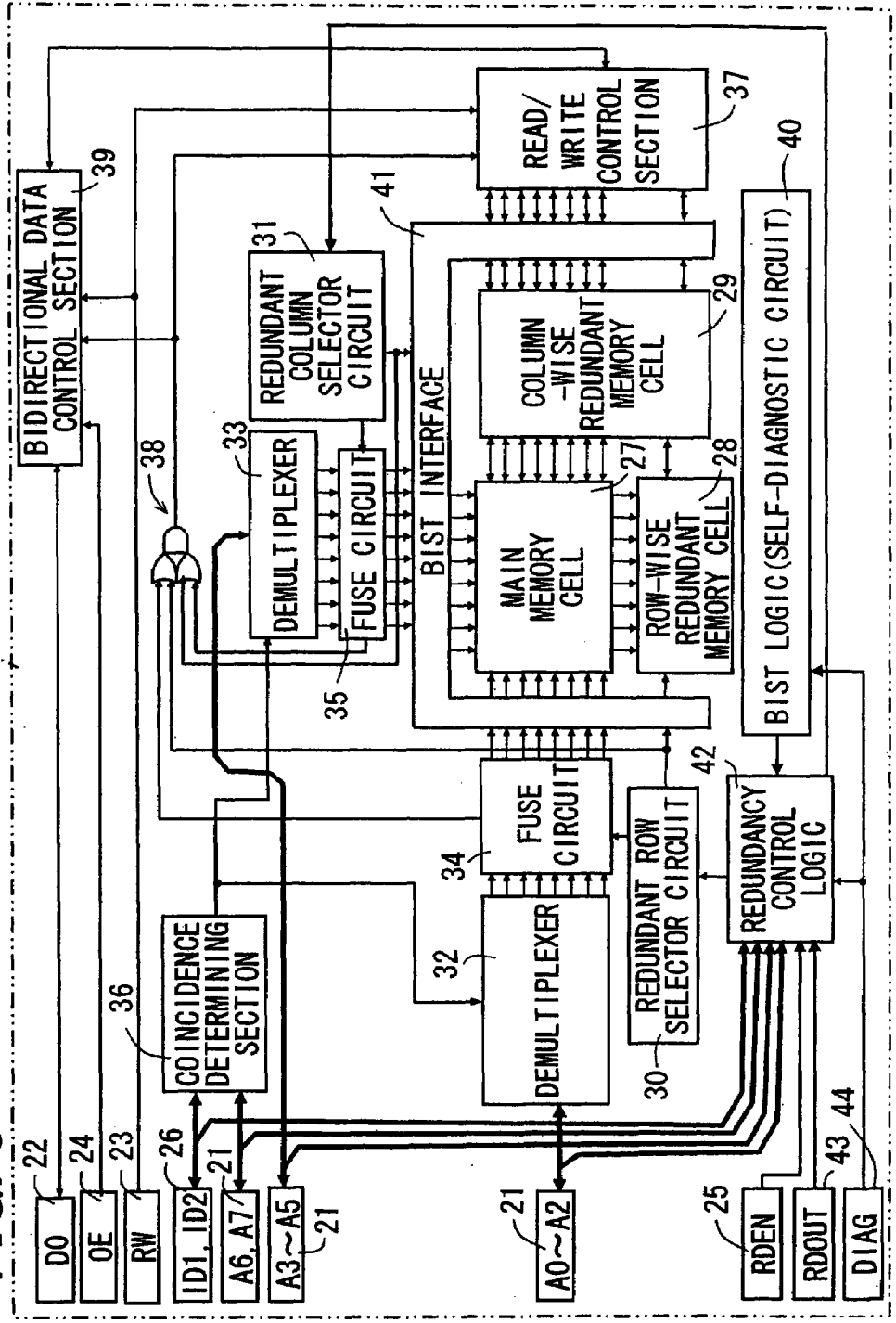
FIG. 9 is a circuit diagram schematically showing a memory chip 200 accomplished by way of a second embodiment of the invention.

FIG. 9 is a circuit diagram schematically showing a memory chip 200 accomplished by way of the second embodiment of the invention. In the second embodiment, the memory chip 200, namely the memory apparatus, is designed to be 64 bits in storage capacity. By preparing four pieces of the memory chips 200, 256-bit storage capacity is realized. In this construction, 1 bit is regarded as 1 word.

The memory chip 200 is provided with 8 pieces of 1-bit address terminals 21. Also disposed in the memory chip 200 are: a 1-bit data terminal 22; a read/write designation terminal 23; an output enabling terminal 24; a redundancy execution terminal 25; and a non-illustrated chip selector terminal. The chip selector terminal allows selection between permission and inhibition for the operation of the chip as a whole. In addition, the memory chip 200 includes an identification number designation terminal 26 acting as identification number storing means to identify the four memory chips 200 on an individual basis.

The memory chip 200 is composed of: a main memory cell 27; a row-wise redundant memory cell 28; a column-wise redundant memory cell 29; a redundant row selector circuit 30; a redundant column selector circuit 31; a first demultiplexer 32; a second demultiplexer 33; a first fuse circuit 34; and a second fuse circuit 35. The main memory cell 27 serves to store data at the intersection of a plurality of data lines and word lines intersecting at right angles. The first and second demultiplexers 32 and 33 are each of a circuit for specifying a given one of 8 lines on the basis of 3-bit addresses. For example, the first to third bits of the address are assigned to the data line extending in the row-wise direction of the main memory cell 27, and the fourth to sixth bits of the address are assigned to the word line extending in a direction perpendicular to the row-wise direction, namely the column-wise direction of the main memory cell 27. In this way, the main memory cell 27 is allowed to function as a 64-bit memory.

In the event of a break in the data line as well as the word line of the main memory cell 27, the main memory cell 27 incurs a defective part therearound. At this time, the redundant row selector circuit 30 as well as the redundant column selector circuit 31 is operated to specify a data line of the row-wise redundant memory cell 28 and a word line of the column-wise redundant memory cell 29 in order to select the defective data and word lines in the main memory cell 27. In the second embodiment, the row-wise redundant memory cell 28 has a single data line array and the column-wise redundant memory cell 29 has a single word line array. However, the row-wise redundant memory cell 28 and the column-wise redundant memory cell 29 may be provided with a plurality of data lines and a plurality of word lines, respectively, in expectation of the possibility that a break will occur over* a plurality of data and word lines of the main memory cell 27.

The first and second fuse circuits 34 and 35 sever the defective data and word lines of the main memory cell 27. More specifically, in response to a redundancy execution signal and a to-be-severed line selection signal from the redundant row selector circuit 30 and the redundant column selector circuit 31, the first and second fuse circuits 34 and 35 are driven to sever target data and word lines of the main memory cell 27. Moreover, the first and second fuse circuits 34 and 35 are provided with a terminal for outputting a signal indicating that data readout has been completed in the main memory cell 27 (not shown in the figure). The output of this terminal is adjusted to be equal to the logical OR of the total outputs of the first and second fuse circuits 34 and 35. The first and second fuse circuits 34 and 35 of the second embodiment are conformable to those of the first embodiment that have previously been described with reference to FIGS. 2 through 4, and therefore no detailed explanation therefor will be given below. Likewise, the redundant row selector circuit 30 and the redundant column selector circuit 31 are conformable to those of the first embodiment that have previously been described with reference to FIG. 6, and therefore no detailed explanation therefor will be given below.

The memory chip 200 further includes a coincidence determining section 36 for correlating the main memory cell 27 with a predetermined 64-bit memory space out of a 256-bit memory space. For example, only in the case where the 7th bit and the 8th bit of the address agree with the identification number of the memory chip 200, the 64-bit memory space is correlated with the memory chip 200.

The memory chip 200 still further includes a BIST logic 40, a BIST interface 41, and a redundancy control logic 42. By virtue of the BIST logic 40 acting as self-diagnostic means, the memory chip 200 is able to check the presence or absence of a defect in its own main memory cell 27. The redundancy control logic 42 is operated to relieve a defect in the main memory cell 27 of the memory chip 200 of interest in accordance with a diagnosis result obtained by the BIST logic 40, as well as to receive a redundancy-based relief signal from another memory chip 200. Moreover, when the row-wise redundant memory cell 28 and the column-wise redundant memory cell 29 of the memory chip 200 of interest are found to be used up, the redundancy control logic 42 is operated to put out a redundancy-based relief signal which is transmitted to another memory chip 200 by way of a relief request terminal 43 acting as redundancy-based relief request making means.

Of the address terminals 21, the one to which the first to third bits are inputted is electrically connected to the first demultiplexer 32 and the redundancy control logic 42, the one to which the fourth to sixth bits are inputted is electrically connected to the second demultiplexer 33 and the redundancy control logic 42, and the one to which the seventh and eighth bits are inputted is electrically connected to the coincidence determining section 36 and the redundancy control logic 42. The data terminal 22 is electrically connected to the bidirectional data control section 39. The read/write designation terminal 23 is electrically connected to the read/write control section 37 and the bidirectional data control section 39. The output enabling terminal 24 is electrically connected to the bidirectional data control section 39. The redundancy execution terminal 25 is electrically connected to the redundancy control logic 42. The identification number designation terminal 26 is electrically connected to the coincidence determining section 36 and the redundancy control logic 42.

The redundant row selector circuit 30 is electrically connected to the first fuse circuit 34 and one of the OR circuits of the AND-OR gate 38, as well as to the row-wise redundant memory cell 28 by way of the BIST interface 41. The redundant column selector circuit 31 is electrically connected to the second fuse circuit 35 and the other of the OR circuits of the AND-OR gate 38, as well as to the column-wise redundant memory cell 29 by way of the BIST interface 41. The first demultiplexer 32 is electrically connected to the first fuse circuit 34. The second demultiplexer 33 is electrically connected to the second fuse circuit 35. The first fuse circuit 34 is electrically connected to the main memory cell 27 and one of the OR circuits of the AND-OR gate 38. The second fuse circuit 35 is electrically connected to the main memory cell 27 and the other of the OR circuits of the AND-OR gate 38.

The coincidence determining section 36 is electrically connected to the first demultiplexer 32 and the second demultiplexer 33. The read/write control section 37 is electrically connected to the row-wise redundant memory cell 28 and the column-wise redundant memory cell 29 by way of the BIST interface 41, as well as to the bidirectional data control section 39. The AND circuit electrically connected to the two OR circuits of the AND-OR circuit 38 is electrically connected to the read/write control section 37 and the bidirectional data control section 39. The BIST logic 40 is electrically connected to the BIST interface 41 and the redundancy control logic 42. The BIST interface 41 is electrically connected to the main memory cell 27, the row-wise redundant memory cell 28, and the column-wise redundant memory cell 29. The redundancy control logic 42 is electrically connected to the redundant row selector circuit 30, the redundant column selector circuit 31, and the relief request terminal 43. A diagnosis relief terminal 44 is electrically connected to the BIST logic 40 and the redundancy control logic 42.

FIGS. 10A and 10B are views each schematically showing a redundancy-based relief signal which is impressed at the redundancy execution terminal 25. When a redundancy-based relief command RDEN stands at the H level, as shown in FIG. 10A, the first to third bits of the redundancy-based relief signal represent a row (column)-wise redundant resistor value; the fourth bit represents a row or a column; the fifth and sixth bits represent a sender number; and the seventh and eighth bits represent an identification number. When the third bit of the H-level redundancy-based relief signal represents a row, the row of the main memory cell 27, namely the data line, is subjected to a redundancy-based relief. On the other hand, when the third bit of the H-level redundancy-based relief signal represents a column, the column of the main memory cell 27, namely the word line, is subjected to a redundancy-based relief. When the redundancy-based relief command RDEN stands at the L level, as shown in FIG. 10B, the first to sixth bits of the redundancy-based relief signal represent an address, and the seventh and eighth bits represent an identification number. Although, in FIGS. 10A and 10B, the redundancy-based relief signal is taken as parallel data, it may be taken as serial data instead. The sender number represented by the fifth and sixth bits corresponds to the other memory chip 200 which sent the redundancy-based relief signal.

FIG. 11 is a flow chart showing a procedure for conducting a diagnosis of the main memory cell 27 to be effected by the BIST logic 40. The procedure is started in Step s0 and then proceeds to Step s1.

In Step s1, the BIST logic 40 performs a L-level signal writing with respect to the memory addresses of the memory space in the main memory cell 27 successively in order from the starting address (=address 0) to the highest address, and thereafter the procedure proceeds to Step s2.

In Step s2, the BIST logic 40 confirms that it is possible to read back the L-level signals written in Step 1 with respect to the memory addresses of the memory space in the main memory cell 27 successively in order from the starting address (=address 0) to the highest address. After it is confirmed that the L-level readout has been worked out, the BIST logic 40 performs H-level signal writing with respect to the memory addresses of the memory space in the main memory cell 27 successively in order from the starting address (=address 0) to the highest address, and thereafter the procedure proceeds to Step s3.

In Step s3, the BIST logic 40 confirms that it is possible to read back the H-level signals written in Step 2 with respect to the memory addresses of the memory space in the main memory cell 27 successively in order from the starting address (=address 0) to the highest address. After it is confirmed that the H-level readout has been worked out, the BIST logic 40 performs L-level signal writing with respect to the memory addresses of the memory space in the main memory cell 27 successively in order from the starting address (=address 0) to the highest address, and thereafter the procedure proceeds to Step s4.

In Step s4, the BIST logic 40 confirms that it is possible to read back the L-level signals written in Step 3 with respect to the memory addresses of the memory space in the main memory cell 27 successively in order from the highest address to the starting address (=address 0). After it is confirmed that the L-level readout has been worked out, the BIST logic 40 performs H-level signal writing with respect to the memory addresses of the memory space in the main memory cell 27 successively in order from the starting address (=address 0) to the highest address, and thereafter the procedure proceeds to Step s5.

In Step s5, the BIST logic 40 confirms that it is possible to read back the H-level signals written in Step 4 with respect to the memory addresses of the memory space in the main memory cell 27 successively in order from the highest address to the starting address (=address 0). After it is confirmed that the H-level readout has been worked out, the BIST logic 40 performs L-level signal writing with respect to the memory addresses of the memory space in the main memory cell 27 successively in order from the starting address (=address 0) to the highest address, and thereafter the procedure proceeds to Step s6.

In Step s6, the BIST logic 40 confirms that it is possible to read back the L-level signals written in Step 5 with respect to the memory addresses of the memory space in the main memory cell 27 successively in order from the starting address (=address 0) to the highest address. After it is confirmed that the L-level readout has been worked out, the BIST logic 40 performs H-level signal writing with respect to the memory addresses of the memory space in the main memory cell 27 successively in order from the starting address (=address 0) to the highest address, and thereafter the procedure proceeds to Step s7.

In Step s7, the BIST logic 40 confirms that it is possible to read back on the H-level signals written in Step 6 with respect to the memory addresses of the memory space in the main memory cell 27 successively in order from the starting address (=address 0) to the highest address. After it is confirmed that the H-level readout has been worked out, the procedure proceeds to Step s8. Hereupon, the diagnosis operation comes to an end.

The BIST logic circuit 40 may be constituted by a combination of a counter and a sequence circuit so long as the diagnosis procedure described just above with reference to the flow chart shown in FIG. 11 can be executed successfully. Note that, in the main memory cell 27, when the data line is specified, reading and writing operations can be carried out in a parallel manner relative to all of the word lines. Therefore, the counter of the BIST logic circuit 40 may be adjusted to operate in a parallel manner relative to the word line. The BIST interface 41 is operated in such a way as to ensure that none of the circuit elements but the BIST logic 40 is permitted to have access to the main memory cell 27 and that the only signals to be transmitted to the main memory cell 27 are the ones produced by the BIST logic 40 in the course of the diagnosis procedure as shown in the flow chart of FIG. 11, under the control of the redundant row selector circuit 30, the redundant column selector circuit 31, and the bidirectional data control section 39.

In the diagnosis procedure as shown in the flow chart of FIG. 11, if the expected signal has not been read out, it will be judged that the memory chip has a defective main memory cell 27, and thus a redundancy-based relief will be demanded. Since all of the word lines operate in a parallel manner, if a defect exists in the data line, the continuous word lines will take on abnormal values. This makes it possible to check whether or not the defect extends over the physically neighboring locations in the main memory cell 27. Moreover, if a defect exists in the word line, the expected signals will not be read out in a predetermined sequence, wherefore the defect of the word line can be detected. In demanding a redundancy-based relief, selection between the row-wise redundant memory cell 28 and the column-wise redundant memory cell 29 is made in accordance with defect occurrence patterns.

Figure 12:
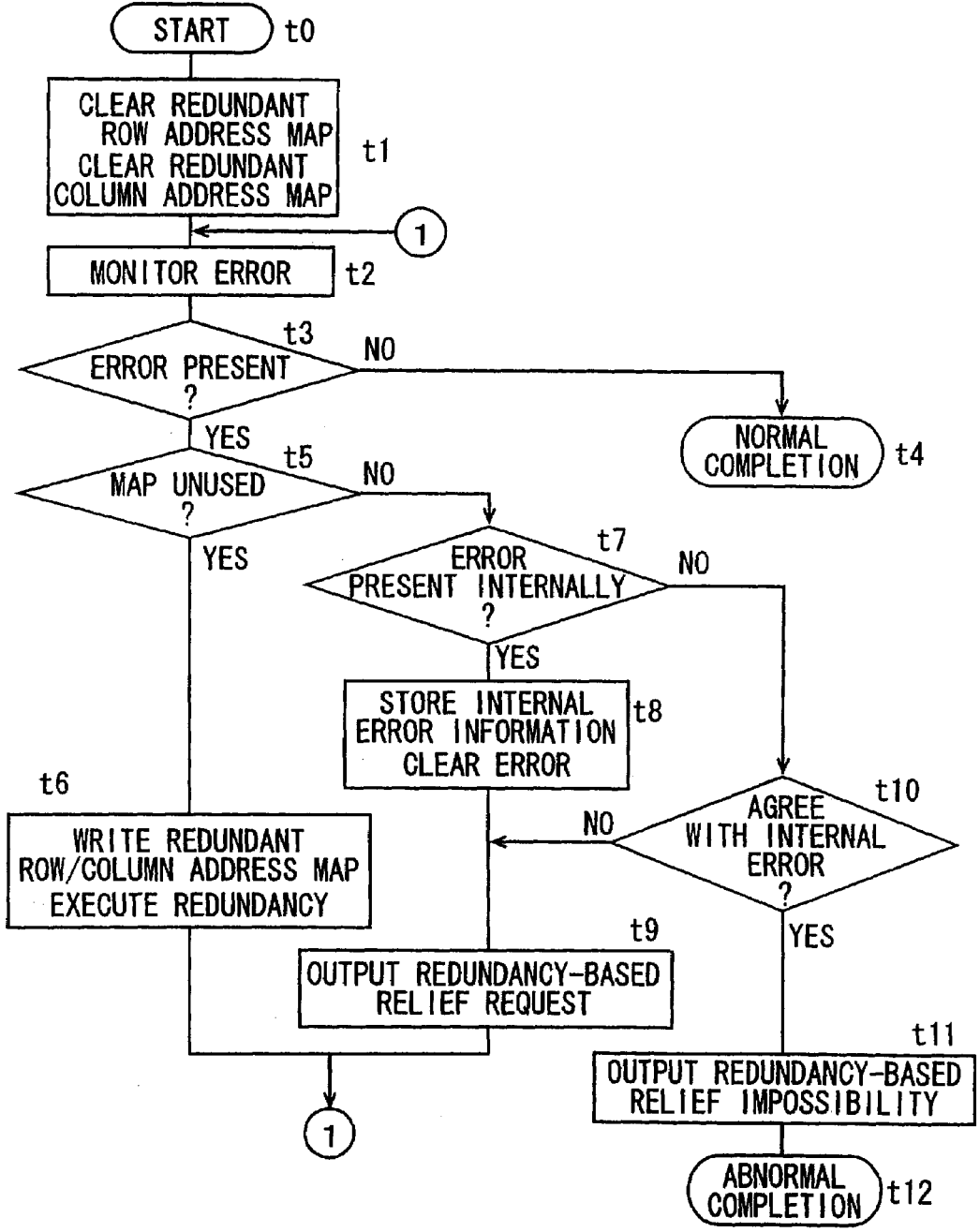
FIG. 12 is a flow chart showing a procedure for operating a redundancy control logic 42.

FIG. 12 is a flow chart showing a procedure for operating the redundancy control logic 42. The procedure is started in Step t0 and then proceeds to Step t1.

In Step t1, the redundancy control logic 42 is operated to clear the use of the redundancy-based relief command decoder circuit 85 of the redundant row selector circuit 30 as well as the redundant column selector circuit 31, namely the information stored in the Q3 bit (terminal) of the memory circuit 86, and then the procedure proceeds to Step t2. In Step t2, the redundancy control logic 42 effects control of the BIST logic 40 in a manner so as to check the presence or absence of a defect in the main memory cell 27. In the presence of a defect, the BIST logic 40 is operated to make a redundancy-based relief request, and then the procedure proceeds to Step t3.

In Step t3, the redundancy control logic 42 determines whether a defect is present in the main memory cell 27 or not based on the check result obtained in Step t2. When the absence of a defect is determined by the redundancy control logic 42, namely the main memory cell 27 is judged as being free of a defect and thus being able to function normally, the procedure proceeds to Step t4. Hereupon, the operation comes to an end. When the presence of a defect is determined by the redundancy control logic 42, the procedure proceeds to Step t5.

In the case where the main memory cell 27 is judged as incurring a defect in Step t3, the procedure proceeds to Step t5. In Step t5, the redundancy control logic 42 determines whether or not the row-wise redundant memory cell 28 as well as the column-wise redundant memory cell 29 is in use based on the information stored in the memory circuit 86 of the redundant row selector circuit 30 as well as the redundant column selector circuit 31. When the row-wise redundant memory cell 28 as well as the column-wise redundant memory cell 29 is judged as being unused by the redundancy control logic 42, the procedure proceeds to Step t6. When the row-wise redundant memory cell 28 as well as the column-wise redundant memory cell 29 is judged as being used by the redundancy control logic 42, the procedure proceeds to Step t7. Moreover, in a case where a plurality of the row-wise redundant memory cells 28 as well as the column-wise redundant memory cells 29 are provided, in Step t5, the redundancy control logic 42 determines whether or not all of the row-wise redundant memory cells 28 as well as the column-wise redundant memory cells 29 are in use. When it is judged by the redundancy control logic 42 that not all the row-wise redundant memory cells 28 as well as the column-wise redundant memory cells 29 are used, the procedure proceeds to Step t6. When it is judged by the redundancy control logic 42 that all of the row-wise redundant memory cells 28 as well as the column-wise redundant memory cells 29 are used, the procedure proceeds to Step t7.

In the case where, in Step t5, the row-wise redundant memory cell 28 as well as the column-wise redundant memory cell 29 is judged as being unused, or it is judged that not all the row-wise redundant memory cells 28 as well as the column-wise redundant memory cells 29 are used, the procedure proceeds to Step t6. In Step t6, with respect to the redundant row selector circuit 30 as well as the redundant column selector circuit 31, the redundancy control logic 42 is operated to write, in the Q0 to Q2 terminal and the Q5, Q6 terminal of the memory circuit 86, the address of a memory space corresponding to the unused row-wise redundant memory cell 28 as well as the column-wise redundant memory cell 29, while bringing the Q3 terminal of the memory circuit 86 into the H-level state. Then, the procedure returns to Step t2. Moreover, when there is a match between the identification number of the memory chip 200 and the identification number included in the redundancy-based relief signal, namely, the memory chip 200 is placed in the self-repair mode, in Step t6, the redundancy control logic 42 drives the FUSE-SET terminal of the redundancy-based relief command decoder circuit 85 of the redundant row selector circuit 30 as well as the redundant column selector circuit 31 to put out a signal. In this way, the first and second fuse circuits 34 and 35 are driven to sever and negate the defective word and data lines of the main memory cell 27 under the control of the redundancy control logic 42.

In the case where, in Step t5, the row-wise redundant memory cell 28 as well as the column-wise redundant memory cell 29 is judged as being in use, or it is judged that all of the row-wise redundant memory cells 28 as well as the column-wise redundant memory cells 29 are used, the procedure proceeds to Step t7. In Step t7, the redundancy control logic 42 determines whether or not a defect exists in the main memory cell 27 of the memory chip 200 of interest. When it is judged by the redundancy control logic 42 that the main memory cell 27 of the memory chip 200 of interest is defective, the procedure proceeds to Step t8. When it is judged by the redundancy control logic 42 that the main memory cell 27 of the memory chip 200 of interest is free of a defect, namely a defect exists in the main memory cell 27 of another memory chip 200, the procedure proceeds to Step t10.

In the case where the main memory cell 27 of the memory chip 200 of interest is judged as being defective in Step t7, the procedure proceeds to Step t8. In Step t8, under the control of the redundancy control logic 42, the first and second fuse circuits 34 and 35 are driven to sever and negate the defective word and data lines of the main memory cell 27 of the memory chip 200 of interest. Then, the procedure proceeds to Step t9.

In Step t9, the redundancy control logic 42 is operated to put out a redundancy-based relief signal which is transmitted to another memory chip 200. Then, the procedure returns to Step t2.

In the case where the main memory cell 27 of another memory chip 200 is judged as being defective in Step t7, the procedure proceeds to Step t10. In Step t10, the redundancy control logic 42 performs a comparison between a self-repair request and external repair request to check a match. When it is judged by the redundancy control logic 42 that the self-repair request coincides with the external repair request, the procedure proceeds to Step t11. When it is judged by the redundancy control logic 42 that the self-repair request does not coincide with the external repair request, the procedure proceeds to Step t9.

In Step t11, the redundancy control logic 42 judges that the memory chip 200 is unable to repair the main memory cell 27 thereof on its own and also the main memory cell 27 cannot be repaired by another memory chip 200. In this case, a redundancy-based relief unexcitable signal is produced, and then the procedure proceeds to Step t12. Hereupon, the memory chip 200 is determined to be faulty, and the operation comes to an end.

Figure 13:
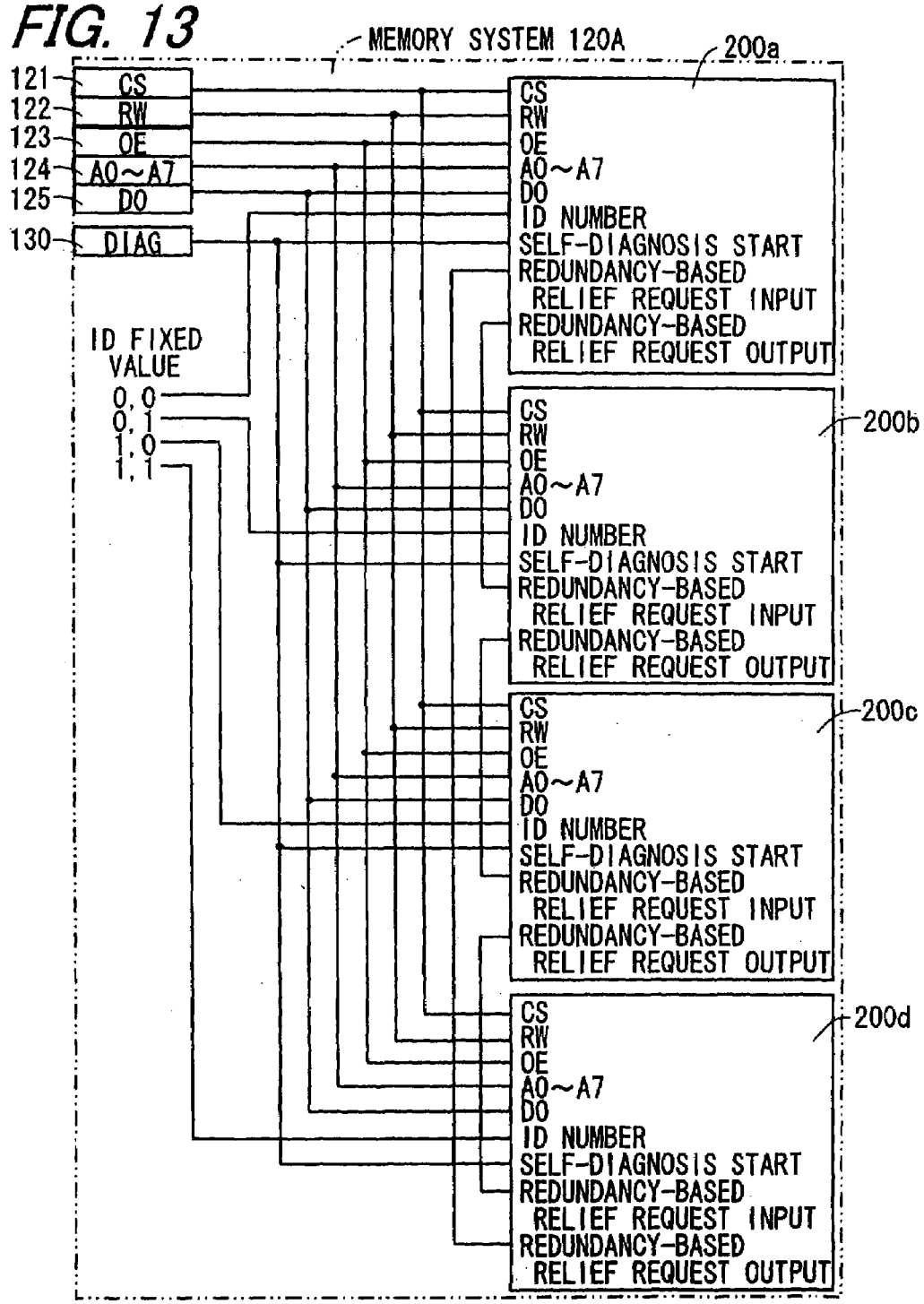
FIG. 13 is a circuit diagram schematically showing a memory system 120A incorporating four pieces of the memory chips 200.

FIG. 13 is a circuit diagram schematically showing a memory system 120A incorporating four pieces of the memory chips 200. Specifically, the memory system 120A is composed of: a first memory chip 200a; a second memory chip 200b; a third memory chip 200c; and a fourth memory chip 200d. These memory chips 200a through 200d have basically the same structure as the memory chip 200 thus far described. Also included in the memory system 120A are: a chip selector terminal 121; a read/write designation terminal 122; an output enabling terminal 123; an address terminal 124; a data terminal 125; and a diagnosis relief terminal 130.

The chip selector terminal 121 of the memory system 120A is electrically connected to the chip selector terminals of the first to fourth memory chips 200a to 200d. The read/write designation terminal 122 of the memory system 120A is electrically connected to the read/write designation terminals 23 (refer to FIG. 9) of the first to fourth memory chips 200a to 200d. The output enabling terminal 123 of the memory system 120A is electrically connected to the output enabling terminals 24 (refer to FIG. 9) of the first to fourth memory chips 200a to 200d. The address terminal 124 of the memory system 120A is electrically connected to the read/write address terminals 21 (refer to FIG. 9) of the first to fourth memory chips 200a to 200d. The data terminal 125 of the memory system 120A is electrically connected to the data terminals 22 (refer to FIG. 9) of the first to fourth memory chips 200a to 200d. The first to fourth memory chips 200a to 200d are each assigned a fixed identification number in advance. For example, the identification number of the first memory chip 200a is given as (0, 0); the identification number of the second memory chip 200b is given as (0, 1); the identification number of the third memory chip 200c is given as (1, 0); and the identification number of the fourth memory chip 200d is given as (1, 1). These values can be individually stored in the corresponding identification number designation terminals 26 of the first to fourth memory chips 200a to 200d. The diagnosis relief terminal 130 of the memory system 120A is electrically connected to the diagnosis relief terminals 44 (refer to FIG. 9) of the first to fourth memory chips 200a to 200d.

In the memory system 120A constructed by daisy-chain connecting the memory chips, the input and output terminals of the first to fourth memory chips 200a to 200d are so connected that a redundancy-based relief request makes the circuit of a group of the first to fourth memory chips 200a to 200d. Moreover, in the case of employing the JTAG function, the capability of designating the identification number of the memory chip 200 and the redundancy-based relief command as well can be programmed as part of a JTAG instruction of the JTAG function. The first to fourth memory chips 200a to 200d can be distinguished by means of data or chip selector.

Figure 14:
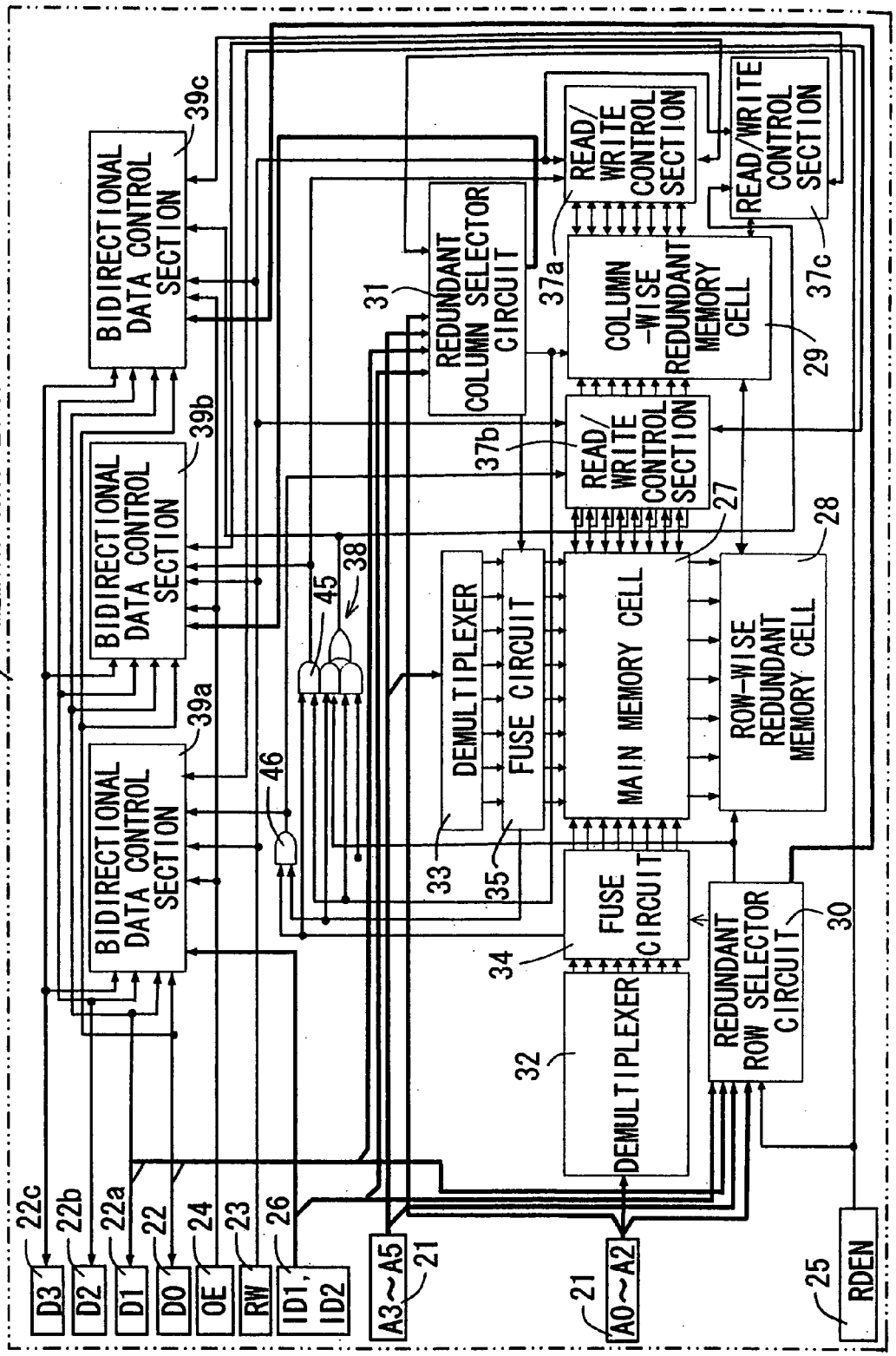
FIG. 14 is a circuit diagram schematically showing a memory chip 200A accomplished by way of a third embodiment of the invention.

FIG. 14 is a circuit diagram schematically showing a memory chip 200A accomplished by way of the third embodiment of the invention. In the third embodiment, the memory chip 200A, namely the memory apparatus, is designed to be 64 bits in storage capacity. By preparing four pieces of the memory chips 200A, 256-bit storage capacity is realized. In this construction, 4 bit is regarded as 1 word.

The memory chip 200A is provided with 6 pieces of 1-bit address terminals 21. Also disposed in the memory chip 200A are: four pieces of 1-bit data terminals (22, 22a, 22b, and 22c); a read/write designation terminal 23; an output enabling terminal 24; a redundancy execution terminal 25; and a non-illustrated chip selector terminal. The chip selector terminal allows selection between permission and inhibition for the operation of the chip as a whole. In addition, the memory chip 200A includes an identification number designation terminal 26 acting as identification number storing means to identify the four memory chips 200A on an individual basis.

The memory chip 200A is composed of: a main memory cell 27; a row-wise redundant memory cell 28; a column-wise redundant memory cell 29; a redundant row selector circuit 30; a redundant column selector circuit 31; a first demultiplexer 32; a second demultiplexer 33; a first fuse circuit 34; and a second fuse circuit 35. The main memory cell 27 serves to store data at the intersection of a plurality of data lines and word lines intersecting at right angles. The first and second demultiplexers 32 and 33 are each of a circuit for specifying a given one of 8 lines on the basis of 3-bit addresses. For example, the first to third bits of the address are assigned to the data line extending in the row-wise direction of the main memory cell 27, and the fourth to sixth bits of the address are assigned to the word line extending in a direction perpendicular to the row-wise direction, namely the column-wise direction of the main memory cell 27. In this way, the main memory cell 27 is allowed to function as a 64-bit memory.

In the event of a break in the data line as well as the word line of the main memory cell 27, the main memory cell 27 incurs a defective part there around. At this time, the redundant row selector circuit 30 as well as the redundant column selector circuit 31 is operated to specify a data line of the row-wise redundant memory cell 28 and a word line of the column-wise redundant memory cell 29 in order to select the defective data and word lines in the main memory cell 27. In the third embodiment, the row-wise redundant memory cell 28 has a single data line array and the column-wise redundant memory cell 29 has a single word line array. However, the row-wise redundant memory cell 28 and the column-wise redundant memory cell 29 may be provided with a plurality of data lines and a plurality of word lines, respectively, in expectation of the possibility that a break will occur over a plurality of data and word lines of the main memory cell 27.

The first and second fuse circuits 34 and 35 sever the defective data and word lines of the main memory cell 27. More specifically, in response to a redundancy execution signal and a to-be-severed line selection signal from the redundant row selector circuit 30 as well as the redundant column selector circuit 31, the first and second fuse circuits 34 and 35 are driven to sever target data and word lines of the main memory cell 27. Moreover, the first and second fuse circuits 34 and 35 are provided with a terminal for outputting a signal indicating that data readout has been completed in the main memory cell 27 (not shown in the figure). The output of this terminal is adjusted to be equal to the logical OR of the total outputs of the first and second fuse circuits 34 and 35. The first and second fuse circuits 34 and 35 of the third embodiment are conformable to those of the first embodiment that have previously been described with reference to FIGS. 2 through 4, and therefore no detailed explanation therefor will be given below. Likewise, the redundant row selector circuit 30 and the redundant column selector circuit 31 are conformable to those of the first embodiment that have previously been described with reference to FIG. 6, and therefore no detailed explanation therefor will be given below.

Of the address terminals 21, the one to which the first to third bits are inputted is electrically connected to the redundant row selector circuit 30, the redundant column selector circuit 31, and the first demultiplexer 32, and the one to which the fourth to sixth bits are inputted is electrically connected to the redundant row selector circuit 30, the redundant column selector circuit 31, and the second demultiplexer 33. The first data terminal 22 is electrically connected to the redundant row selector circuit 30, the redundant column selector circuit 31, a first bidirectional data control section 39a, a second bidirectional data control section 39b, and a third bidirectional data control section 39c. The second data terminal 22a is electrically connected to the redundant row selector circuit 30, the redundant column selector circuit 31, the first bidirectional data control section 39a, the second bidirectional data control section 39b, and the third bidirectional data control section 39c. The third data terminal 22b is electrically connected to the first bidirectional data control section 39a, the second bidirectional data control section 39b, and the third bidirectional data control section 39c. The fourth data terminal 22c is electrically connected to the first bidirectional data control section 39a, the second bidirectional data control section 39b, and the third bidirectional data control section 39c.

The read/write designation terminal 23 is electrically connected to a first read/write control section 37a, a second read/write control section 37b, a third read/write control section 37c, the first bidirectional data control section 39a, the second bidirectional data control section 39b, and the third bidirectional data control section 39c. The output enabling terminal 24 is electrically connected to the first bidirectional data control section 39a, the second bidirectional data control section 39b, and the third bidirectional data control section 39c. The redundancy execution terminal 25 is electrically connected to the redundant row selector circuit 30 and the redundant column selector circuit 31. The identification number designation terminal 26 is electrically connected to the redundant row selector circuit 30, the redundant column selector circuit 31, and the first bidirectional data control section 39a.

The redundant row selector circuit 30 is electrically connected to the row-wise redundant memory cell 28, the first fuse circuit 34, one and the other of the AND circuits of the AND-OR gate 38, and the third bidirectional data control section 39c. The redundant column selector circuit 31 is electrically connected to the column-wise redundant memory cell 29, the second fuse circuit 35, one of the AND circuits of the AND-OR gate 38, and a first AND gate 45 composed of an AND circuit. The first demultiplexer 32 is electrically connected to the first fuse circuit 34. The second demultiplexer 33 is electrically connected to the second fuse circuit 35. The first fuse circuit 34 is electrically connected to the main memory cell 27, the first AND gate 45, and a second AND gate 46 composed of an AND circuit. The second fuse circuit 35 is electrically connected to the main memory cell 27, the other AND circuit of the AND-OR gate 38, and the second AND gate 46.

The first read/write control section 37a is electrically connected to the column-wise redundant memory cell 29 and the second bidirectional data control section 39b. The second read/write control section 37b is electrically connected to the main memory cell 27, the column-wise redundant memory cell 29, and the first bidirectional data control section 39a. The third read/write control section 37c is electrically connected to the column-wise redundant memory cell 29 and the third bidirectional data control section 39c, as well as to the row-wise redundant memory cell 28 by way of the column-wise redundant memory cell 29.

The AND-OR gate 38 composed of two AND circuits and a single OR circuit is electrically connected to the third read/write control section 37c and the third bidirectional data control section 39c. The first AND gate 45 is electrically connected to the first read/write control section 37a and the second bidirectional data control section 39b. The second AND gate 46 is electrically connected to the second read/write control section 37b and the first bidirectional data control section 39a. Under the control of the first bidirectional data control section 39a, the main memory cell 27 is correlated with a predetermined data bit space of the 64-word memory space. For example, with an ID-number match obtained, the data bit space can be related to the 64-bit space.

In order to provide a relief for the main memory cell 27, the first read/write control section 37a, the second read/write control section 37b, and the third read/write control section 37c need to be independent to one another. There redundant row selector circuit 30 as well as the redundant column selector circuit 31 has the memory circuit 86 for dealing with the ID number-corresponding part of a redundancy-based relief signal. In addition to the data from the third read/write control section 37c electrically connected to the row-wise redundant memory cell 28 and the first read/write control section 37a electrically connected to the column-wise redundant memory cell 29, the identification number corresponding to the relief data is given to the second bidirectional data control section 39b and the third bidirectional data control section 39c. The data is outputted to the corresponding data terminals 22, 22a, 22b, and 22c.

In the case of relieving a defect in the main memory cell 27 of the memory chip of interest, the first bidirectional data control section 39a is placed in a non-operating state with respect to the main memory cell 27, but the other bidirectional data control section related to the relief is responsible for data input and output. Moreover, in the case of relieving a defect in the main memory cell 27 of another memory chip 200A, because of the difference in identification number, input and output are effected to a different data bit in the memory chip 200A. Further, the memory chip 200A having the defective main memory cell 27 is not responsible for data input and output.

Figure 15:
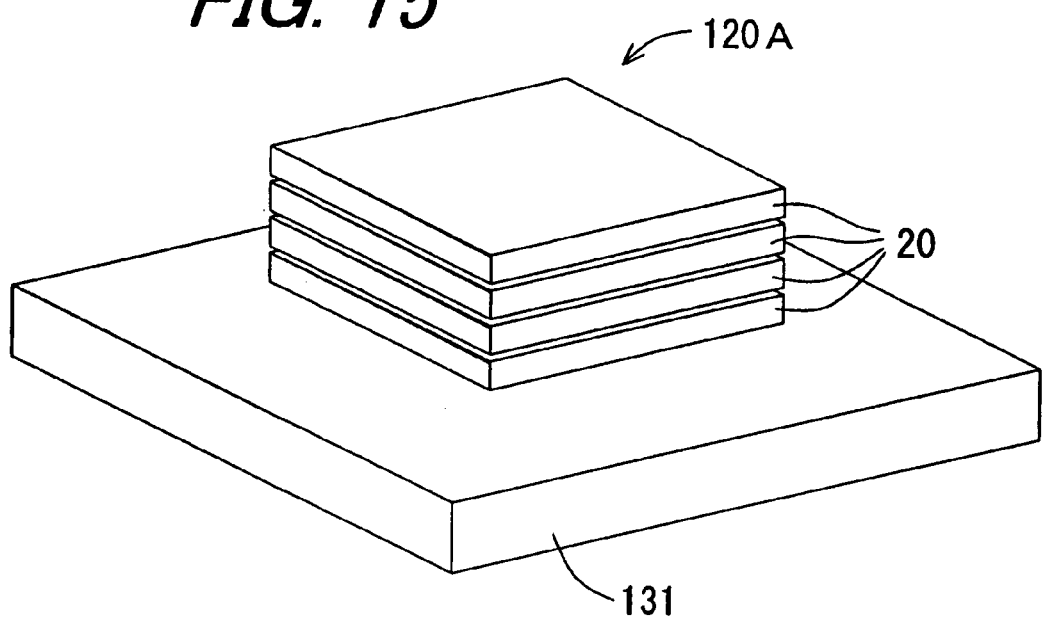
FIG. 15 is a perspective view showing the memory system 120A having a stacked structure.

FIG. 15 is a perspective view showing the memory system 120A having a stacked structure. The memory system 120A is constructed by stacking together four pieces of the memory chips 20, 200, 200A of the first, second, third embodiment in the thicknesswise direction. In the memory system 120A, the terminals 22 through 26 of the individual memory chips 20 are electrically connected to a common electrode formed so as to pass through all the memory chips 20 in the thicknesswise direction, as shown in FIGS. 8 and 13.

Figure 16A:
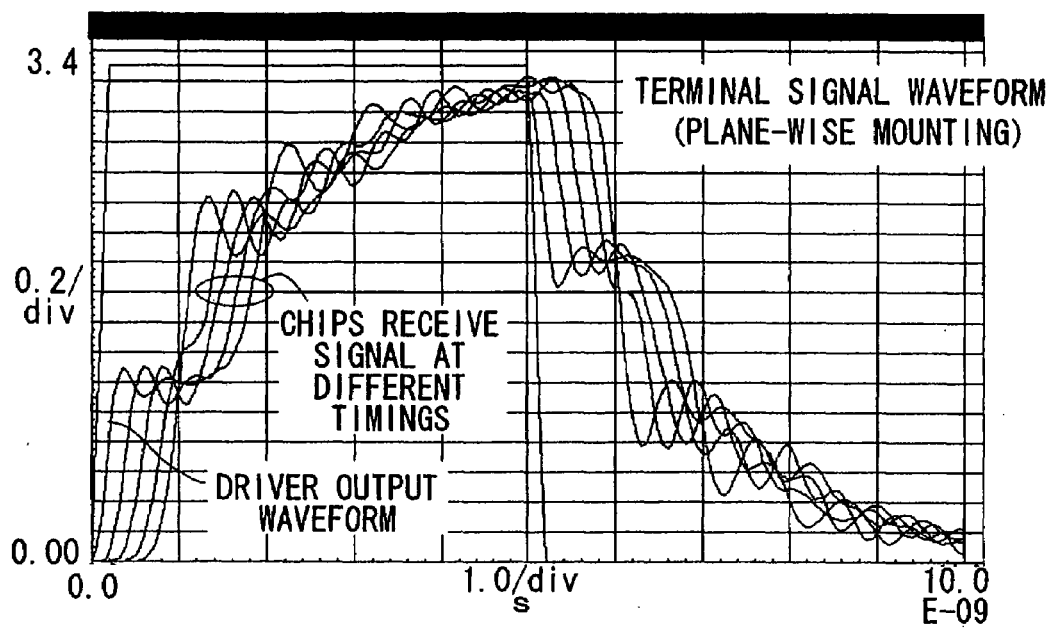
FIG. 16A is a graph pertaining to the memory system constructed by connecting a plurality of the memory chips 20 plane-wise, illustrating the result of a simulation on the change of a voltage in the input terminal of each of the memory chips 20 with time as observed when a signal is externally applied to the memory system.
Figure 16B:
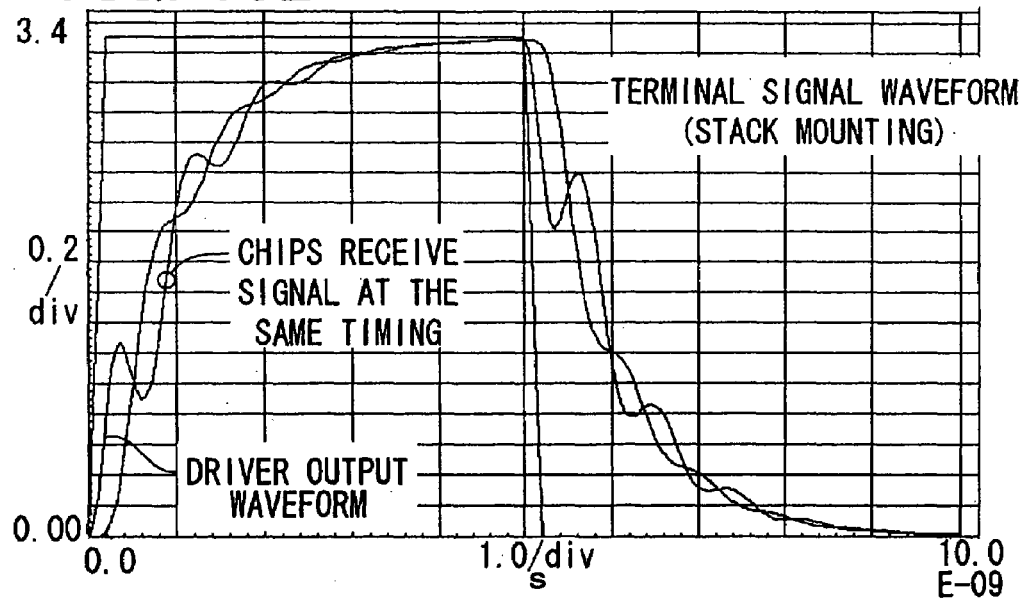
FIG. 16B is a graph pertaining to the memory system 120A having a stacked structure, illustrating the result of a simulation on the change of a voltage in the input terminal of each of the memory chips 20 with time as observed when a signal is externally applied to the memory system 120A.
Figure 17:
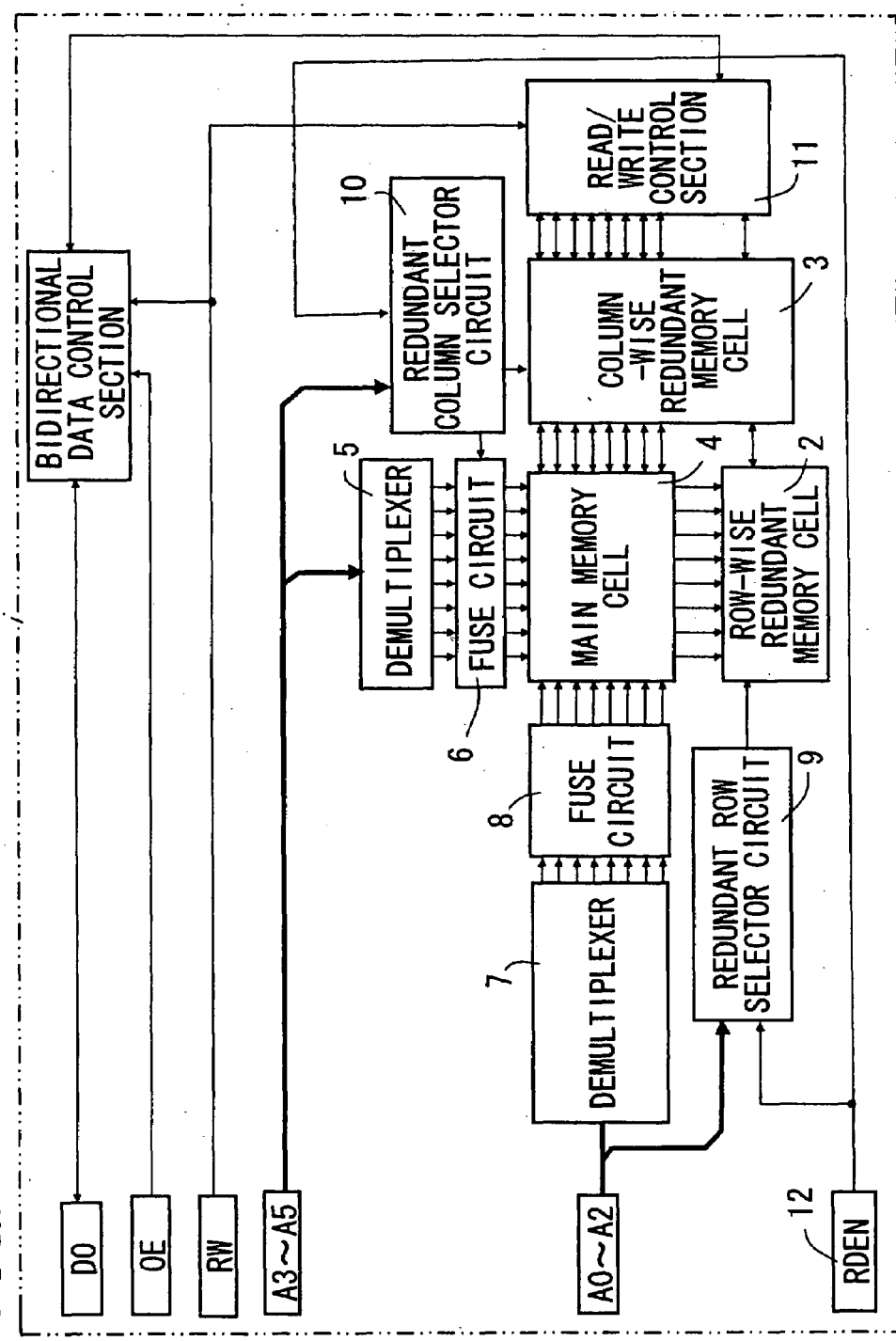
FIG. 17 is a block diagram showing the constitution of the conventional memory chip 1.

FIG. 16A is a graph pertaining to the memory system constructed by connecting a plurality of the memory chips 20 plane-wise, illustrating the result of as simulation on the change of a voltage in the input terminal of each of the memory chips 20 with time as observed when a signal is externally applied to the memory system. FIG. 16B is a graph pertaining to the memory system 120A having a stacked structure, illustrating the result of a simulation on the change of a voltage in the input terminal of each of the memory chips 20 with time as observed when a signal is externally applied to the memory system 120A. In FIGS. 16A and 16B, time is taken along the horizontal axis, and voltage is taken along the vertical axis. In the memory system constructed by connecting the memory chips 20 plane-wise, as shown in FIG. 16A, the transmission of a signal is delayed by a time interval corresponding to the dimension of the memory chip 20 in the extending direction (given the dimension of 10 mm square). On the other hand, in the memory system 120A having a stacked structure, as shown in FIG. 16B, although the transmission of a signal is slightly delayed by a time interval corresponding to the thickness of the memory chip 20 (given the thickness of 50 μm), a plurality of the memory chips 20 receive a signal almost at the same time.

Accordingly, in the memory system 120A having a stacked structure constructed by stacking together the memory chips 20 in the thicknesswise direction, the difference in signal-receiving time among the memory chips 20 can be minimized; wherefore, in the memory system 120A, the individual memory chips 20 behave as if they are assembled in a single-piece construction. That is, in the memory system 120A, the memory chips 20 are able to perform mutual redundancy-based relief operations without causing any problem in the operational speed of the memory system 120A. This makes it possible to operate the memory system 120A at high speed.

The most desirable form of the memory system 120A is a memory system having a stacked structure that employs the memory chips 200 of the second embodiment and incorporates a JTAG function for specifying ID numbers. Such a memory system is free from productivity deterioration in a batch bonding step during the manufacturing process even if the number of the terminals is increased.

The invention may be embodied in other specific forms without departing from the spirit or essential characteristics thereof. The present embodiments are therefore to be considered in all respects as illustrative and not restrictive, the scope of the invention being indicated by the appended claims rather than by the foregoing description and all changes which come within the meaning and the range of equivalency of the claims are therefore intended to be embraced therein.

INDUSTRIAL APPLICABILITY

According to the invention, when an identification number included in a relief command to be inputted to the relief command input means coincides with an identification number stored in the identification number storing means, a memory space corresponding to a defect existing in the main memory means of the memory apparatus specified by the relief command is severed by the memory space severing means. Moreover, the memory apparatus stands ready to repair the defective main memory means thereof by using the redundant memory means of its own, or ready to have the main memory means repaired by another memory apparatus. Further, in response to the relief command, the allocating means operates in such a way that the memory space corresponding to the defect of the main memory means is replaced with a memory space of the redundant memory means. On the other hand, when an identification number included in a relief command to be inputted to the relief command input means does not coincide with an identification number stored in the identification number storing means, in order to relieve a defect existing in the main memory means of another memory apparatus specified by the relief command, a memory space corresponding to the defect is replaced with a memory space of the redundant memory means of the memory apparatus of interest. Accordingly, even if the main memory means incurs a defect in the course of the manufacture of the memory apparatus, the memory apparatus will never become a defective item. This helps improve the manufacturing yields.

According to the invention, the self-diagnostic means checks a presence or absence of a defect in the main memory means and in the redundant memory means. The defective location storing means stores the location of a defect existing in the main memory means. This makes it possible to ascertain the whereabouts of the defect in the main memory means. The relief information storing means stores information on how the main memory means is repaired by using the redundant memory means. The redundancy-based relief request making means demands that, when it is found impossible for the memory apparatus of interest to repair the main memory means thereof by using the redundant memory means of its own, said main memory means should be given a relief by another memory apparatus. In this way, even if the memory apparatus is unable to repair the main memory means thereof on its own, the main memory means can be repaired by another memory apparatus.

According to the invention, the redundancy-based relief request receiving means receives a relief request from the redundancy-based relief request making means of another memory apparatus. In response to the relief request from the redundancy-based relief request making means of another memory apparatus, the allocating means operates in such a way that the defective memory space in the main memory means of another memory apparatus is replaced with a memory space of the redundant memory means of the memory apparatus of interest. In this way, even if the memory apparatus is unable to repair the main memory means thereof on its own, the main memory means can be repaired by another memory apparatus. Accordingly, even if the main memory means incurs a defect in the course of the manufacture of the memory apparatus, the memory apparatus will never become a defective item. This helps improve the manufacturing yields even further.

According to the invention, the redundancy-based relief request receiving means is capable of receiving a relief request from the redundancy-based relief request making means of each and every memory apparatus. Accordingly, the memory apparatuses are able to perform mutual main memory means-relief operations.

According to the invention, a plurality of the memory apparatuses are stacked on top of each other in the thicknesswise direction. The redundancy-based relief request making means and the redundancy-based relief request receiving means of all the memory apparatuses are electrically connected to a common electrode formed so as to pass through all the memory apparatuses in the thicknesswise direction. In this construction, in contrast to the case where a plurality of the memory apparatuses are electrically connected to one another in a plane-wise arrangement, the difference in signal-receiving time among the memory apparatuses can be reduced. This makes it possible to operate the memory apparatus at high speed.

The invention claimed is:

1. A memory apparatus comprising:
  main memory means;
  redundant memory means for relieving a defect existing in the main memory means;
  identification number storing means for storing an identification number corresponding to a main memory cell;
  relief command input means to which a relief command including an identification number is inputted;
  memory space severing means for severing a memory space corresponding to a defect existing in the main memory means from the main memory means so as to render the memory space inoperative; and
  allocating means for allowing allocation of the redundant memory means so as for a defective memory space of the main memory means to be replaced with a memory space of the redundant memory means,
  wherein the allocating means is operated in such a manner that, when an identification number included in a relief command coincides with an identification number stored in the identification number storing means, a memory space corresponding to a defect existing in the main memory means specified by the relief command inputted to the relief command input means is severed from the main memory means so as to be rendered inoperative,
  when an identification number included in a relief command coincides with an identification number stored in the identification number storing means, a memory space corresponding to a defect existing in the main memory means specified by the relief command inputted to the relief command input means is replaced with a memory space of the redundant memory means,
  and when an identification number included in a relief command does not coincide with an identification number stored in the identification number storing means, a memory space corresponding to a defect existing in the main memory means of another memory apparatus specified by the relief command inputted to the relief command input means is replaced with a memory space of the redundant memory means of the memory apparatus of interest.

2. The memory apparatus of claim 1, further comprising:
  self-diagnostic means for checking a presence or absence of a defect in the main memory means and in the redundant memory means;
  defective location storing means for storing a location of a defect existing in the main memory means;
  relief information storing means for storing information on how the main memory means is repaired by the redundant memory means; and
  redundancy-based relief request making means for demanding that, when it is found impossible for the memory apparatus of interest to repair the main memory means thereof by using the redundant memory means of its own, said main memory means should be given a relief by another memory apparatus electrically connected to the memory apparatus of interest.

3. The memory apparatus of claim 2, further comprising:
  redundancy-based relief request receiving means for receiving a relief request from the redundancy-based relief request making means of another memory apparatus,
  wherein the allocating means is operated in such a manner that, when there is a relief request from the redundancy-based relief request making means of another memory apparatus, a defective memory space of the main memory means of another memory apparatus is replaced with a memory space of the redundant memory means of the memory apparatus of interest.

4. The memory apparatus of claim 3, wherein the redundancy-based relief request receiving means is capable of receiving a relief request from the redundancy-based relief request making means of each and every memory apparatus.

5. The memory apparatus of claim 4, wherein the memory apparatus is such constituted that the other memory apparatuses is stacked on a top thereof in thickwise direction, and the redundancy-based relief request making means and the redundancy-based relief request receiving means of all the memory apparatuses are electrically connected to a common electrode formed so as to pass through all the memory apparatuses in the thicknesswise direction.

* * * * *